(12) United States Patent
Jung et al.

(10) Patent No.: US 12,173,213 B2
(45) Date of Patent: Dec. 24, 2024

(54) INORGANIC LUMINESCENT MATERIALS FOR SOLAR RADIATION CONVERSION DEVICES

(71) Applicant: PHYSEE Group B.V., Delft (NL)

(72) Inventors: Ana Jung, Delft (NL); Sadiq Van Overbeek, Delft (NL); Chung-che Kao, Delft (NL); Otto Van Den Berg, Delft (NL)

(73) Assignee: PHYSEE Group B.V., Delft (NL)

( * ) Notice: Subject to any disclaimer, the term of this patent is extended or adjusted under 35 U.S.C. 154(b) by 0 days.

(21) Appl. No.: 18/179,636

(22) Filed: Mar. 7, 2023

(65) Prior Publication Data
US 2023/0265340 A1  Aug. 24, 2023

Related U.S. Application Data

(63) Continuation of application No. 17/251,681, filed as application No. PCT/NL2019/050357 on Jun. 12, 2019, now abandoned.

(30) Foreign Application Priority Data

Jun. 12, 2018 (NL) .................................... 2021109

(51) Int. Cl.
*C09K 11/77* (2006.01)
*C09K 11/02* (2006.01)
(Continued)

(52) U.S. Cl.
CPC .......... *C09K 11/7764* (2013.01); *C09K 11/02* (2013.01); *C09K 11/0883* (2013.01);
(Continued)

(58) Field of Classification Search
CPC ................. H01L 31/055; H01L 31/02322
See application file for complete search history.

(56) References Cited

U.S. PATENT DOCUMENTS

2008/0272688 A1  11/2008  Yoshimura
2009/0032083 A1  2/2009  Torrance et al.
(Continued)

FOREIGN PATENT DOCUMENTS

CN   101182414 A   5/2008
EP   3050126 B1    7/2017
(Continued)

OTHER PUBLICATIONS

International Search Report and Written Opinion for corresponding International application No. PCT/NL2019/050357; dated Sep. 10, 2019 (15 pages).
(Continued)

*Primary Examiner* — Ryan S Cannon
(74) *Attorney, Agent, or Firm* — Mendelsohn Dunleavy, PC

(57) ABSTRACT

A device for converting solar radiation is described wherein the device comprises an inorganic luminescent material comprising a host material doped with $Mn^{5+}$ ions for converting radiation of the UV and/or visible part of the electromagnetic spectrum into radiation of the near-infrared radiation part of the electromagnetic spectrum, preferably the infrared part between 1150 nm and 1250 nm, preferably around 1190 nm (the infrared emission peak of $Mn^{5+}$); or, an amorphous host material doped with $Sm^{2+}$ or $Tm^{2+}$ ions, the amorphous host material including the elements Al, Si, O and N (SiAlON) for converting radiation of the UV and/or visible part of the electromagnetic spectrum into radiation of a longer wavelength, preferably a longer wavelength between 650 nm and 800 nm or a longer wavelength of around 1140 nm; and, at least one photovoltaic device for converting at least part of the converted radiation into electrical power.

16 Claims, 12 Drawing Sheets

(51) Int. Cl.
*C09K 11/08* (2006.01)
*C09K 11/57* (2006.01)
*C09K 11/71* (2006.01)
*E06B 3/67* (2006.01)
*E06B 7/28* (2006.01)
*E06B 9/24* (2006.01)
*G02B 6/42* (2006.01)
*H01L 31/055* (2014.01)
*H02S 20/26* (2014.01)
*H02S 40/20* (2014.01)
*H05B 33/14* (2006.01)
*E06B 3/663* (2006.01)

(52) U.S. Cl.
CPC .............. *C09K 11/57* (2013.01); *C09K 11/71* (2013.01); *E06B 3/6715* (2013.01); *E06B 7/28* (2013.01); *E06B 9/24* (2013.01); *G02B 6/42* (2013.01); *G02B 6/4298* (2013.01); *H01L 31/055* (2013.01); *H02S 20/26* (2014.12); *H02S 40/20* (2014.12); *H05B 33/14* (2013.01); *E06B 3/66314* (2013.01); *E06B 2003/66385* (2013.01); *E06B 2009/2417* (2013.01)

(56) References Cited

U.S. PATENT DOCUMENTS

| | | |
|---|---|---|
| 2009/0056791 A1 | 3/2009 | Pfenninger et al. |
| 2010/0052502 A1 | 3/2010 | Ota |
| 2010/0307587 A1 | 12/2010 | Sakamoto et al. |
| 2011/0012086 A1 | 1/2011 | Tsakalakos et al. |
| 2011/0193025 A1 | 8/2011 | Ichikawa |
| 2011/0240120 A1 | 10/2011 | Ronda et al. |
| 2012/0080066 A1 | 4/2012 | Tsakalakos et al. |
| 2012/0080067 A1 | 4/2012 | Tsakalakos et al. |
| 2012/0080070 A1 | 4/2012 | Tsakalakos et al. |
| 2012/0132930 A1 | 5/2012 | Young et al. |
| 2013/0098438 A1 | 4/2013 | Kawai et al. |
| 2014/0182679 A1 | 7/2014 | Rosenberg et al. |
| 2014/0262811 A1 * | 9/2014 | Moon ................... C01B 19/007 205/543 |
| 2015/0194555 A1 | 7/2015 | Zhang et al. |
| 2016/0204297 A1 | 7/2016 | Vasiliev et al. |
| 2021/0107258 A1 | 4/2021 | Horie et al. |

FOREIGN PATENT DOCUMENTS

| | | |
|---|---|---|
| JP | 2008-13674 A | 1/2008 |
| JP | 2010-53183 A | 3/2010 |
| WO | 2010139290 A2 | 12/2010 |
| WO | 2011114262 A2 | 9/2011 |
| WO | 2012007872 A1 | 1/2012 |
| WO | 2013003894 A1 | 1/2013 |
| WO | 2017038712 A1 | 3/2017 |
| WO | 2017195954 A1 | 11/2017 |
| WO | 2018097350 A1 | 5/2018 |

OTHER PUBLICATIONS

De Boer, Dick K.G., et al. "Progress in phosphors and filters for luminescent solar concentrators." Optics Express 20. S3 (2012): A395-A405.

Sargent, Edward H. "Infrared photovoltaics made by solution processing." Nature Photonics 3.6 (2009): 325-331.

Yang, Zhigang et al. "Photoluminescence and thermal stability of β-SiAlON:Re (Re=Sm, Dy) phosphors." Optical Materials 35.7 (2013): 1348-1351.

Cao, Renping, et al. "Spectroscopic Investigation on $BaSO_4$:($Mn^{6+}$, $Mn^{5+}$) crystal." ECS Journal of Solid State Science and Technology 2.11 (2013): R237-R240.

Zhang, Xiaowen, et al. "A general strategy for controllable synthesis of $Ba_3(MO_4)_2$:$Mn^{5+}$ (M=V, P) nanoparticles." RSC Advances 7.17 (2017): 10564-10569.

First Office Action for corresponding Chinese application No. 201980051557.9; dated Oct. 8, 2022 (25 pages) Machine Translation.

Cao, RenPing, et al. "Near-infrared emission $Ba_3(PO_4)_2$:$Mn^{5+}$ phosphor and potential application in vivo fluorescence imaging." Spectrochimica Acta Part A: Molecular and Biomolecular Spectroscopy 128 (2014): 671-673.

Notice of Reasons for Rejection for corresponding Japanese application No. 2020-569987; dated Jun. 6, 2023 (18 pages).

* cited by examiner

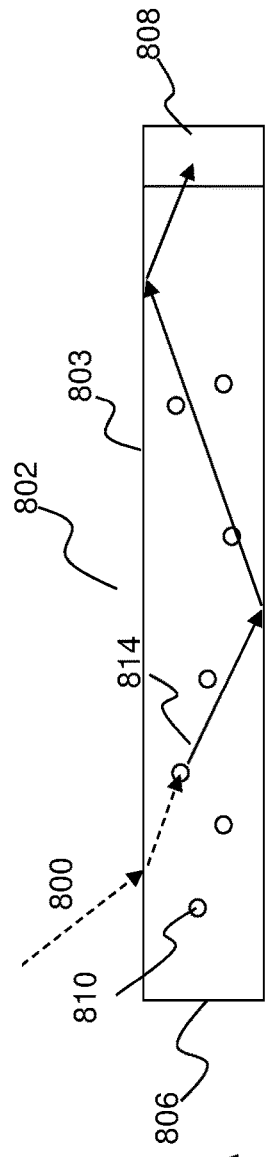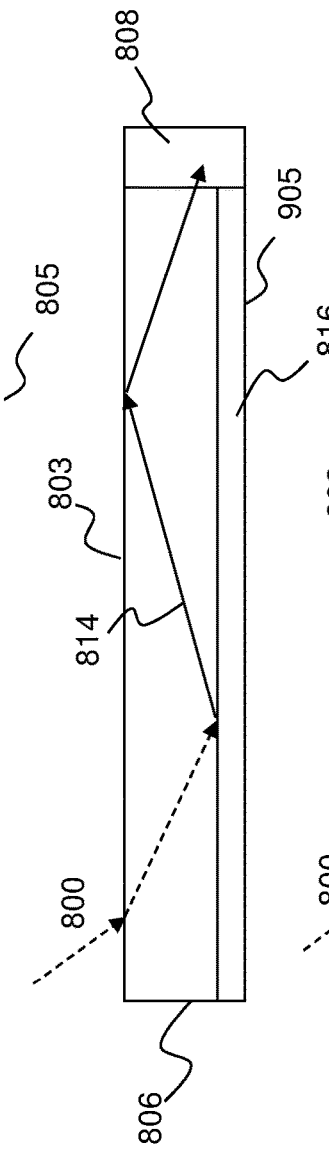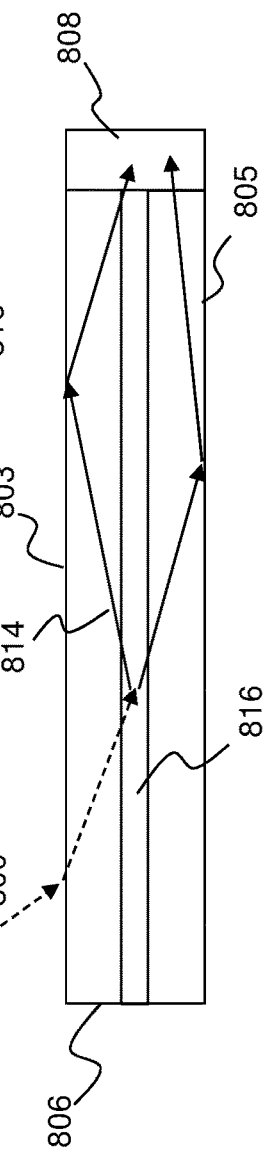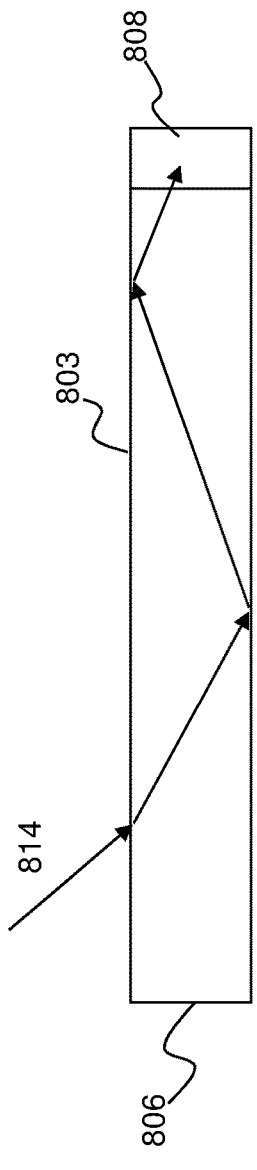

INORGANIC LUMINESCENT MATERIALS FOR SOLAR RADIATION CONVERSION DEVICES

CROSS-REFERENCE TO RELATED APPLICATIONS

The present application is a continuation of U.S. patent application Ser. No. 17/215,681, filed on Dec. 11, 2020, which, in turn, is a 371 continuation of PCT/NL2019/050357 filed on Jun. 12, 2019, which, in turn, claims priority to Netherlands patent application no. 2021109, filed on Jun. 12, 2018, the disclosures of which are hereby incorporated by reference in their entirety as if fully set forth herein.

FIELD OF THE INVENTION

The invention relates to inorganic luminescent materials for solar radiation conversion devices, and, in particular, though not exclusively, to $Mn^{5+}$, $Sm^{2+}$ and/or $Tm^{2+}$ doped inorganic luminescent materials for solar radiation conversion devices such as photovoltaic devices or luminescent solar concentrators, to solar conversion devices comprising such inorganic luminescent materials and methods of synthesizing such materials.

BACKGROUND OF THE INVENTION

Luminescent solar concentrators (LSCs) aim at lowering cost of solar energy generation using a cheap luminescent plate to concentrate sunlight onto small-area strip-type photovoltaic devices at the sides of the plate. In such scheme sunlight is absorbed by the luminescent material in the plate and re-emitted in all directions. A considerable fraction of the light is trapped in the plate by total internal reflection. This way the plate acts as a light guide wherein the re-emitted light is guided to the perimeter of the plate where photovoltaic devices convert the light into electric power. Similarly, simple luminescent conversion layers (LCL) on top of or integrated in a photovoltaic device, e.g. a solar cell, may be used to increase the overall conversion efficiency of the device. In such scheme (part of the) sunlight is absorbed by the luminescent material of the conversion layer and re-emitted in all directions. A considerable fraction of the light is coupled into the device either directly or indirectly by total internal reflection. This way the absorption efficiency in the cell is enhanced due to an enhanced optical path length and photovoltaic device has a higher external quantum efficiency (EQE) at the emitted wavelength of luminescent material.

While solar panels are already contributing to the world energy production, LSCs and LCLs are still not commercially available. Although the concept is appealing, the production of large-sized LSCs and LCLs that have sufficient efficiency is a considerable challenge and include solving a number of non-trivial problems. These problems mainly concern shortcomings associated with the luminescent materials that are used in an LSC or LCL.

Ideally, an efficient luminescent material that can be used for large-scale LSC and LCL applications should meet certain requirements. The material should have advantageous luminescent properties, including: a broad spectral absorption, a high absorption efficiency over the whole absorption spectrum, non-overlapping absorption and emission spectra (i.e. a large Stokes' shift), a high luminescent quantum efficiency (i.e. the ratio between emitted and absorbed photons) and a photon emission that matches the spectral response of the PV-cell it is coupled to. Additionally, the material should have optical and structural properties that are compatible with the materials and/or applications of the optical devices in which the luminescent material is used.

State of the art luminescent materials do not meet these requirements thus inhibiting large scale applications of these materials. A detailed description of these problems is provided in the article by de Boer et al., Progress in phosphors and filters for luminescent solar concentrators, 29 Mar. 2012, vol. 20, No. 53, Optics Express.

An interesting group of luminescent materials that are currently under investigation for applications in LCSs are the inorganic rare-earth compounds. Typically, these materials include a polycrystalline host material that is doped with inorganic rare-earth ions. These materials can exhibit relatively large shifts between absorption and emission. For example, in EP3050126 luminescent materials based on $Tm^{2+}$ ions are described that exhibit broadband absorption and no self-absorption.

Although these materials have advantageous properties in view of the re-absorption problem that occurs when using conventional luminescent materials, the preparation of $Tm^{2+}$ luminescent material requires specific conditions (e.g. inert atmosphere) due to the relatively poor stability of $Tm^{2+}$ ions during processing. Thulium is a rare-earth metal, which can be found in two oxidation states: $Tm^{2+}$ and $Tm^{3+}$ wherein the advantageous luminescent properties are associated with the $Tm^{2+}$ oxidation state. As this oxidation state is the less stable state of the two, it is very challenging to keep the Tm ion in its divalent (2+) state over long period of time and/or to incorporate $Tm^{2+}$ in a stable and industrially acceptable host, i.e. a host that is compatible with the processes and materials that are used in the production of photovoltaic devices and window glazing structures.

Additionally, luminescent layers are realized either in the form of a particle-based coating that includes inorganic luminescent particles dispersed in a binder material, (e.g. an organic binder material), or in the form of a crystalline thin-film layer that is formed using a deposition technique such as sputtering. As described in the article by de Boer et al for both layer-types it is difficult to produce stable broadband absorbing luminescent materials that exhibit excellent luminescent properties and—at the same time—excellent optical properties (in particular low optical scattering of the luminescent light) as well as mechanical/chemical/thermal properties that are compatible with the materials, applications and fabrication processes of optical devices, e.g. LSCs, in which these luminescent materials are used.

For example, microparticles in a conventional luminescent particle-based coating may cause scattering of the luminescent light out of the optical device thus reducing the efficiency of the devices. It may be possible to solve this problem by using a refractive-index-matching binder, however it remains a challenge to produce mechanical and thermally stable layers that absorb enough radiation and that do not or at least exhibit low scattering. Similarly, conventional polycrystalline thin-film luminescent layers may cause scattering of luminescent light out of the layer thereby decreasing the efficiency of the solar conversion device in which the layer is used. Additionally, scattering centres in the thin-film layer may lead to haze which includes reflection and/or diffusion of at least part of the light that falls onto the thin-film layer. Coating a window-pane with such thin-film luminescent layer may thus negatively impact the appearance and/or optical properties of the window-pane as low-reflection haze is essential requirement for large-scale window pane applications.

Hence, there is a need for stable inorganic luminescent materials that exhibit broadband absorption (i.e. absorption over a large part of the solar spectrum), little (or no) self-absorption, emission spectrum that may be easily matched with photovoltaic devices as well as optical, mechanical and/or thermal characteristics that are compatible with the materials, applications and fabrication processes of optical devices in which these luminescent layers are used.

SUMMARY OF THE INVENTION

It is an objective of the invention to reduce or eliminate at least one of the drawbacks known in the prior art.

In an aspect the invention may relate to a $Mn^{5+}$ doped inorganic luminescent material and a solar radiation conversion device comprising such $Mn^{5+}$ doped inorganic luminescent material. The $Mn^{5+}$ doped inorganic luminescent material is particularly suitable for converting solar radiation of the UV, visible and part of the near-infrared of the solar spectrum into radiation of a near-infrared band between 1150 and 1250 nm, preferably radiation of a wavelength of around 1190 nm (the emission peak of $Mn^{5+}$).

In an embodiment, the solar conversion device may comprise an inorganic luminescent material comprising a doped host material, the doped host material being doped with $Mn^{5+}$ ions for converting radiation of the UV band and/or visible band of the solar spectrum into radiation of a predetermined near-infrared band, preferably the wavelength of the near-infrared band between 1150 nm and 1250 nm, more preferably between 1180 nm and 1200 nm (the band around the infrared emission peak of $Mn^{5+}$); and, at least one photovoltaic device for converting at least part of the converted radiation into electrical power.

The $Mn^{5+}$ based inorganic luminescent materials exhibit a large Stokes shift so the problem of self-absorption in the solar radiation conversion device does not occur. The $Mn^{5+}$ based inorganic luminescent material absorbs more than twice the amount of power from the sunlight spectrum when compared to absorption of solar radiation of conventional luminescent materials such as dyes. Further, the infrared emission peak at 1190 nm of the $Mn^{5+}$ based inorganic luminescent materials advantageously coincides with the 1.04 eV bandgap for optimal conversion of the broad solar spectrum (in particular the AM1.5 solar spectrum) on the basis of a single-junction PV device, for example a CIGS-based PV device. This feature allows for improving the overall conversion efficiency of a solar conversion device such as an LSC or LCL. Contrary to $Tm^{2+}$ doped materials used in solar conversion devices known from the prior art, $Mn^{5+}$ doped materials show high stability after exposure to air, which allows the use of the luminescent material in high-end applications such as window panes and glazing assemblies. Furthermore, manganese is amongst 12 most abundant elements on Earth with relatively low price, which gives it an advantage comparing to rare-earth dopants such as the lanthanides.

In an embodiment, the luminescent material may comprise a ternary and/or a quaternary inorganic host material that is doped with $Mn^{5+}$ ions. In an embodiment said luminescence (emission) originates from $Mn^{5+}$ ions. In another embodiment, the $Mn^{5+}$ ions may be present in the host material in a concentration selected from at least one of the following ranges: between 0.01 and 99.99%; 0.01 and 90%; 0.01 and 80%; 0.1 and 50%; 0.2 and 25%; 0.2 and 20%; 0.5 and 10%.

In an embodiment, the ternary inorganic host material may be defined by the general formula $M_3(XO_4)_2$ wherein M=Ca, Ba, Sr and X=P, As, V. In another embodiment, quaternary inorganic host material may be defined by the general formula $M_5(XO_4)_3Y$ wherein M=Ca, Ba, Sr and X=P, As, V and Y=OH, Cl, F. In particular $Ba_3(PO_4)_2$ may be used as a host material for $Mn^{5+}$ ions. The $Mn^{5+}$ doped inorganic materials exhibit superior absorption characteristics for the solar spectrum and have a sharp emission line in the infra-red region, which correspond to $^1E \rightarrow ^3A_2$ transition of $Mn^{5+}$.

In an embodiment, the luminescent $Mn^{5+}$ doped inorganic material may comprise a crystalline thin-film layer or crystalline particles wherein said nanoparticles are embedded in a matrix material. The crystallinity of the material may be nanocrystalline, microcrystalline, polycrystalline. In an embodiment, the particles may be microparticles. In another embodiment, the particles may be nanoparticles. Here, the term microparticles may refer to particles that have average size between 1 and 200 micron, preferably between 1 and 100 micron, more preferably between 1 and 30 micron. The term nanoparticle may refer to particles that have an average size between 1 and 800 nm, preferably between 2 and 600 nm, more preferably between 3 and 500 nm. In a further embodiment, the particles may be selected between 10 and 300 nm, preferably between 20 and 200 nm. The nanoparticles provide the effect that the losses due to scattering in the device are eliminated or at least substantially reduced.

$Mn^{5+}$ based inorganic luminescent material may be synthesized using different methods, including deposition methods that are compatible with conventional semiconductor processing methods so that the $Mn^{5+}$ based inorganic luminescent material may be easily integrated in thin-film solar concentrator devices.

In an embodiment, the solar radiation conversion device comprises a wavelength conversion layer wherein said luminescent $Mn^{5+}$ inorganic material is provided over a light receiving face of said photovoltaic device. In an embodiment said photovoltaic device may comprise said luminescent $Mn^{5+}$ inorganic material. In an embodiment, said photovoltaic device may comprise a thin-film layer comprising said luminescent $Mn^{5+}$ inorganic material.

In an embodiment, said $Mn^{5+}$ luminescent material solar radiation photoluminescence excitation is attributed to $^3A_2 \rightarrow ^3T_2$, $^3A_2 \rightarrow ^3T_1(^3P)$, and $^3A_2 \rightarrow ^3T_1(^3F)$ electronic transitions of $Mn^{5+}$ ion. The strongest photoluminescence sharp line emission peaking at 1190 nm is attributed to the $^1E \rightarrow ^3A_2$ transition of $Mn^{5+}$ ion.

In a further aspect, the invention may relate to the use of a luminescent $Mn^{5+}$ inorganic crystalline material in a luminescent solar energy concentrator or a solar cell.

In another aspect, the invention may relate to a method for synthesising a luminescent $Mn^{5+}$ doped inorganic crystalline material, wherein the method may comprise: sintering an amount of at least a first inorganic ionic compound with a second and third inorganic ionic compounds, said third ionic compound comprising a $Mn^{2+}$ cation, which after heating and oxidation process will reach its $Mn^{5+}$ oxidation state. The whole synthesis method is performed in furnace in air.

In yet another aspect, the invention may relate to a method of forming a luminescent $Mn^{5+}$ doped inorganic polycrystalline thin-film on a substrate, wherein the method may comprise: providing a sputtering target with a luminescent inorganic ionic compound containing $Mn^{5+}$ dopant; introducing a gas into the sputtering chamber; and, applying an RF (or pulsed-DC) electric potential to said sputtering target, thereby causing sputtering of material from the target onto said substrate in order to grow a thin-film layer of said luminescent inorganic ionic compound that is doped with $Mn^{5+}$ cations.

In a further aspect, the invention may relate to an inorganic luminescent material including the elements Al, Si, O and N (SiAlON) which is doped with $Sm^{2+}$ ions for converting solar radiation of at least part of the UV and/or visible spectrum into longer wavelength radiation and a solar radiation conversion device comprising such $Sm^{2+}$ doped SiAlON material. The SiAlON material referred to in this disclosure includes any SiAlON stoichiometry which can be described as a linear combination of the neutral units $SiO2$, $Al2O3$, $AlN$ and $Si3N4$, i.e. $a*SiO2+b*Al2O3+c*AlN+d*Si3N4$, wherein a,b,c and d can take on all values (including non-integer numbers) independent of each other. The $Sm^{2+}$ based inorganic luminescent material is particularly suitable for converting solar radiation of the UV and visible band of the solar spectrum into radiation of a visible red/near infrared band between 650 nm and 800 nm.

In an embodiment, the solar conversion device may comprise an inorganic luminescent material comprising a doped host material, the doped host material being doped with $Sm^{2+}$ and/or $Tm^{2+}$ ions, the host material including the elements Al, Si, O and N (SiAlON) for converting radiation of the UV and visible band of the solar spectrum into radiation of a predetermined visible red band, preferably the wavelength of a visible red band being between 650 nm and 800 nm; and/or, or a predetermined near-infrared band, preferably the wavelength of the near-infrared band being between 1100 and 1200 nm, more preferably between 1130 nm and 1150 nm (the band around the infrared emission peak of $Tm^{2+}$); and, at least one photovoltaic device for converting at least part of the converted radiation into electrical power.

In an embodiment, the $SiAlON:Sm^{2+}$ material may be an amorphous thin-film layer, which exhibits no or at least very low haze. In an embodiment, such amorphous thin-film layer may be formed using a sputtering technique, preferably a reactive magnetron sputtering technique based on the elements Al, Si, O and N (SiAlON) doped with $Sm^{2+}$. These amorphous $SiAlON:Sm^{2+}$ doped layers are able to convert solar radiation of at least part of the UV and/or visible spectrum into longer wavelength radiation, preferably said radiation having a wavelength between 650 nm and 800 nm.

The luminescent, optical, and mechanical properties of $Sm^{2+}$ doped SiAlON material are particularly advantageous for use in a solar conversion device. The $SiAlON:Sm^{2+}$ material has a high transparency that is tunable from completely transparent to completely opaque in the excitation wavelengths of $Sm^{2+}$ ions by either varying the Sm concentration or varying the coating thickness, depending on the application. Due to the amorphous nature of the coating, the haze in the visible range (390 nm to 700 nm) is extremely low and does not exceed the level at which haze can be detected by the human eye. Moreover, the refractive index of the $SiAlON:Sm^{2+}$ material can be tuned between 1.5 and 2.1, mainly by changing the O/N ratio, to match the refractive index of the substrate such as glass for optimum waveguiding efficiency. Furthermore, SiAlON coatings are known to be chemically very stable and easily integrated in the already existing deposition processes of the glass industry.

Beside the optical properties, the luminescent properties of the $SiAlON:Sm^{2+}$ thin film enable the coating to achieve high solar conversion efficiencies. Specific $SiAlON:Sm^{2+}$ materials provide an absorption of 31% of the sunlight and exhibit a Stokes' shift that is large enough such that the problem of self-absorption in the solar radiation conversion device does not occur whilst maintaining a calculated 69% Stokes'.

Furthermore, the $Sm^{2+}$ emission wavelengths, covering a range from 650 nm to 800 nm, enable the conversion into electrical power to take place using 1.12 eV crystalline silicon PV devices that are highly efficient at around 700 nm with an external quantum efficiency of over 90%. Similarly, the $Sm^{2+}$ emission wavelengths enable conversion into electrical power using 1.4 eV bandgap GaAs PV devices.

More generally, the one or more PV devices of the solar concentrating device may be optimized for transforming radiation (generated by the luminescent material) in the visible red/near infrared band between 650 nm and 800 nm or the near-infrared band between 1150 and 1250 nm into electric power.

For example, in an embodiment, the photovoltaic device may include one or more Copper Indium Gallium (di) Selenide (CIGS) layers. In another embodiment, the photovoltaic device may comprise one or more Copper Indium (di)Selenide (CIS) layers. These materials are very efficient for converting emitted near-infrared radiation emitted by the excited dopant sites into electrical energy. In a further embodiment, the photovoltaic device may comprise a NIR/IR absorbing organic layer or a NIR/IR dye-sensitized layer. In an embodiment, the photovoltaic cell may comprise an organic semiconducting layer, e.g. MEH-PVV, that is sensitized with NIR/IR absorbing quantum dots. For example, by controlling the size of low-band gap (binary) semiconductors (e.g. PbS, PbSe, InAs and/or HgTe) quantum dots, the quantum dots may be tailored to absorb in the (near) infrared spectrum between 900 and 2000 nm. See e.g. Sargent et al in "*Solution-based Infra-Red Photovoltaic Devices*, Nature Photonics 3, 325-331 (2009). In another embodiment, the photovoltaic cell may comprise a (single) walled carbon nano-tube layer or a graphene active NIR/IR absorbing layer.

Alternatively, in an embodiment, a photovoltaic device may comprise one or more layers of a IV and III-V semiconductor, including e.g. crystalline (e.g. poly, micro or nanocrystalline) or amorphous silicon solar modules, gallium arsenide (GaAs) type modules, cadmium telluride (CdTe) type modules and/or indium phosphide (InP) solar modules. These materials are particularly suitable for PV devices, which provide efficient conversion in the visible red/near infrared band.

In an embodiment, the solar conversion device may comprise a luminescent inorganic material which is part of or associated with a waveguide structure, the waveguide structure being configured to guide the converted radiation to the photovoltaic device, preferably the waveguide structure being a planar waveguide structure including a first (top) surface and a second (bottom) surface and one or more edges, wherein the at least one photovoltaic device is located at one of the edges of the planar waveguide structure.

In an embodiment, the waveguide structure may comprises a slab or plate of a transparent material having a first (top) surface and a second (bottom) surface, preferably the inorganic luminescent material being provided over at least part of the first and/or second surface of the waveguide structure and/or, wherein the inorganic luminescent material is embedded in the waveguide structure.

In an embodiment, the waveguide structure may comprise a first (inner) glass pane and a second (outer) glass pane and at least one peripheral spacer structure for providing a predetermined separation between the first and second glass pane, wherein the inorganic luminescent material is provided over at least one of the surfaces of the first and/or second glass pane, the space defined by the first and second glass pane defining a waveguide structure for guiding at least part of the radiation generated by the luminescent layer towards at least one photovoltaic device.

In an embodiment, one or more optical layers are provided over the inner or outer surface of the first and/or second glass pane, the one or more optical layers including a reflecting layer adapted to selectively reflect radiation generated by the inorganic luminescent material, preferably the radiation being radiation in a near-infrared band, more preferably radiation in a near-infrared band between 1100 and 1250 nm.

In another embodiment the one or more optical layers may include a refractive layer adapted to selectively refract radiation, preferably radiation between 650 and 800 nm, generated by the inorganic luminescent material, the refractive layer directing at least part of the radiation towards the edges of the waveguide structure.

In an embodiment, the solar conversion device may comprise a photovoltaic device wherein at least part of the luminescent inorganic material is provided over a light receiving face of the at least one photovoltaic device; and/or, wherein the at least one photovoltaic device comprises one or more thin-film layers comprising the luminescent inorganic material.

In yet a further aspect, the invention relates to window assembly comprising: a first (inner) window pane and a second (outer) window pane and at least one peripheral spacer structure for providing a predetermined separation between the first and second window pane, wherein the inorganic luminescent material is provided over at least one of the surfaces of the first and/or second window pane, wherein the first window pane, the second window pane and/or the space defined by the first and second window pane define one or more waveguide structures for guiding at least part of the radiation generated by the luminescent layer towards at least one photovoltaic device; and, one or more photovoltaic devices positioned along one or more edges of the first and second window pane, the light receiving surface of the PV devices being oriented to receive radiation emitted by the luminescent material. Hence, part of one or more surfaces of one or more window panes of a double or multi-pane window structure may be coated with a luminescent material and the space between two window panes or the window panes themselves may be used as a waveguide structures for guiding luminescent radiation towards the photovoltaic devices.

In an embodiment, the inorganic luminescent material comprises: an inorganic luminescent material comprising a doped host material, the doped host material being doped with $Mn^{5+}$ ions for converting radiation of the UV visible and/or near-infrared band of the solar spectrum into radiation of a predetermined near-infrared band, preferably the wavelength of the near-infrared band between 1150 nm and 1250 nm, more preferably between 1180 nm and 1200 nm (the band around the infrared emission peak of $Mn^{5+}$); or, the doped host material, preferably an amorphous doped host material, being doped with $Sm^{2+}$ and/or $Tm^{2+}$ ions, the host material including the elements Al, Si, O and N (SiAlON) for converting radiation of the UV and visible band of the solar spectrum into radiation of a predetermined visible red band, preferably the wavelength of a visible red band being between 650 nm and 800 nm; and/or, or a predetermined near-infrared band, preferably the wavelength of the near-infrared band being between 1100 and 1200 nm, more preferably between 1130 nm and 1150 nm (the band around the infrared emission peak of $Tm^{2+}$);

In an embodiment, one or more optical layers are provided over the inner or outer surface of the first and/or second window pane, the one or more optical layers including a reflecting layer being reflective for radiation generated by the inorganic luminescent material, preferably for radiation in the visible red band being between 650 nm and 800 nm; and/or, or the near-infrared band being between 1100 and 1250 nm. Hence, reflecting layers that reflect the luminescent material may be used to improve reflection of the luminescent radiation towards the photovoltaic device.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIG. 8A-8D depict schematic cross-sections of solar radiation conversion devices according to various embodiments of the invention.

DETAILED DESCRIPTION

Figure 1:
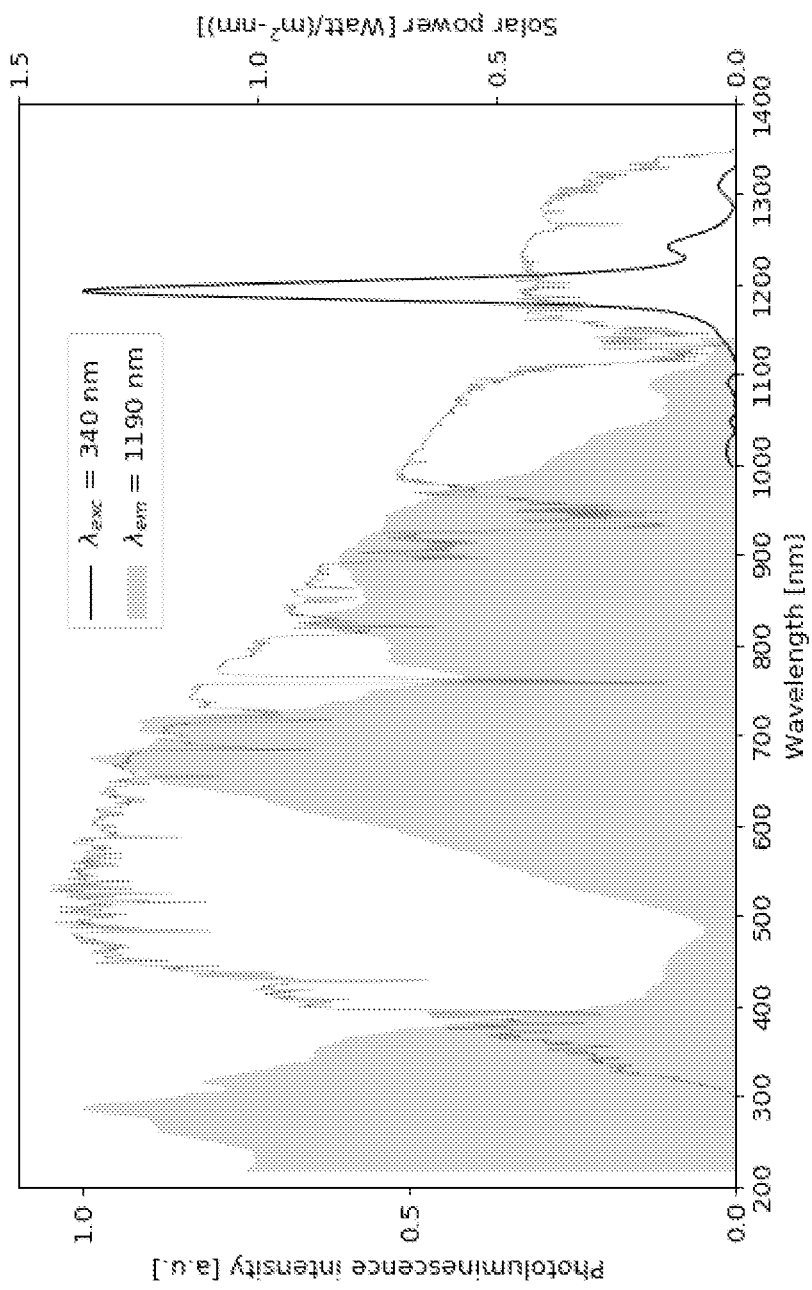
FIG. 1 depicts excitation and emission spectra of $Mn^{5+}$ doped inorganic materials according to various embodiments of the invention.

In this disclosure divalent samarium ($Sm^{2+}$) doped inorganic luminescent materials and pentavalent manganese ($Mn^{5+}$) doped inorganic luminescent materials are described that have superior and improved properties for application in solar conversion devices. The improved properties include: improved luminescent, optical and/or material properties when compared to conventional inorganic phosphors that are used in LSC's.

It has been surprisingly found that certain inorganic host materials comprising $Mn^{5+}$ or $Sm^{2+}$ dopants exhibit absorbing, luminescent and/or optical properties that can be advantageously used in solar conversion devices, such as LSC devices or photovoltaic devices comprising an LCL.

In particular, it has been found that $Mn^{5+}$ doped inorganic materials may absorb a substantial part of the UV band and visible band of the solar spectrum (around 50% of the power from the sun or more) and convert this to radiation of a higher wavelength, preferably a wavelength in the (near) infrared band. In some embodiments, the infrared emission may have a sharp peak in the infra-red band between 1150 and 1250 nm, preferably around 1190 nm. Contrary to $Tm^{2+}$ doped materials for LSC's that are known from the prior art. Unlike $Tm^{2+}$ ions, $Mn^{5+}$ ion shows high stability after exposure to air and are not sensitive to an aqueous environment. Furthermore, manganese is amongst twelve most abundant elements on Earth and has a relatively low price, which gives this dopant material an advantage when compared to lanthanide type dopants such as Sm and Tm.

Further, it has been found that luminescent $Sm^{2+}$ doped SiAlON materials absorb a substantial part of the UV band and the visible band of the solar spectrum and convert radiation in these bands to radiation of a longer wavelength, in particular radiation in the red band between 650 nm and 800 nm. The SiAlON host material exhibits superior properties in terms of mechanical strength, chemical inertness and thermal resistance and is for that reason used in protection and anti-reflection coatings in the glass industry. In particular, the $Sm^{2+}$ doped SiAlON material forms a very stable conversion material that is fully compatible with standard production processes of the glass industry. In some embodiments, the $Sm^{2+}$ doped SiAlON material may be used to form scatter-free amorphous $Sm^{2+}$ doped SiAlON thin-film layers. The use of a low-scattering amorphous SiAlON thin-film layer in a solar conversion device will ensure that the luminescent light does not escape the conversion device by scattering.

In a further embodiment, a luminescent $Tm^{2+}$ doped SiAlON material, preferably an amorphous $Tm^{2+}$ doped SiAlON material, may be used in a solar conversion device. This material, which absorbs a substantial part of the UV band and the visible band of the solar spectrum and converts this radiation in these bands to radiation in the near-infrared band of the spectrum, exhibits excellent optical properties, in particular a low haze. Luminescent $Tm^{2+}$ doped SiAlON material may exhibit emission in the near-infrared band, including a sharp emission peak around 1140 nm. This material exhibits broadband absorption of radiation in the solar spectrum, does not have self-absorption and advantageous material properties such as low-haze and processing compatibility with processes in the glass industry The materials, their advantages and their uses in luminescent conversion layers (LCL) and luminescent solar concentrators (LSCs) are described hereunder in more detail with reference to the figures.

In an embodiment, a luminescent material may comprise a ternary and/or a quaternary inorganic crystalline host material that is doped with $Mn^{5+}$ ions. This way, a luminescent material is formed wherein the luminescence emission originates from $Mn^{5+}$ ions. In an embodiment, the $Mn^{5+}$ ions may be present in the host material in a concentration selected from at least one of the following ranges: between 0.01 and 99.99%; 0.01 and 90%; 0.01 and 80%; 0.1 and 50%; 0.2 and 25%; 0.2 and 20%; 0.5 and 10%.

The ternary inorganic host material may be defined by the general formula M3(XO4)2 wherein M=Ca, Ba, Sr and X=P, As, V. In another embodiment, quaternary inorganic host material may be defined by the general formula M5(XO4)3Y wherein M=Ca, Ba, Sr and X=P, As, V and Y=OH, Cl, F. In general, a large number of host materials may be used for the $Mn^{5+}$ ions. It has been found that a $Mn^{5+}$ doped host material Ba3(PO4)2 forms a particular advantageous inorganic luminescent material for solar conversion applications.

FIG. 1 depicts excitation and emission spectra of a $Mn^{5+}$ doped inorganic luminescent material according to an embodiment of the invention. In particular, these figures depict excitation and emission spectra of a $Mn^{5+}$ doped Ba3(PO4)2 material. The solar radiation photoluminescence excitation is attributed to $^3A_2 \rightarrow ^3T_2$, $^3A_2 \rightarrow ^3T_1(^3P)$, and $^3A_2 \rightarrow ^3T_1(^3F)$ transition of $Mn^{5+}$ ion, respectively. As shown in the figure, the strongest photoluminescence sharp line emission peak at 1190 nm is attributed to the $^1E \rightarrow ^3A_2$ transition of the $Mn^{5+}$ ions.

depicts the overlap between the solar spectrum and the excitation spectrum of the $Mn^{5+}$ doped $Ba_3(PO_4)_2$ material. As shown in this figure, the $Mn^{5+}$ doped inorganic luminescent material exhibits a large Stokes' shift, (i.e. a large difference (in wavelength or energy) between positions of the band maxima of the absorption and emission spectra). Therefore, the problem of self-absorption in a solar radiation conversion device that uses such luminescent material does not occur. Further, the measurements show that the $Mn^{5+}$ doped inorganic luminescent material absorbs more than twice the amount of power from the solar spectrum when compared to absorption of solar radiation of conventional luminescent materials such as dyes. The material exhibits an infrared emission peak at around 1190 nm, which advantageously coincides with the 1.04 eV bandgap for optimal conversion of the broad solar spectrum (in particular the AM11.5 solar spectrum) using a single-junction solar cell, preferably a CIGS-based solar cell.

Manganese (Mn) is a d-block element with atomic number of 25. Owing to its electron configuration [Ar] $3d^5$ $4s^2$ the most likely is to form $Mn^{2+}$ and $Mn^{7+}$ ions, however $Mn^{5+}$ ([Ar] $3d^2$) could be present as $[MnO_4]^{3-}$ when stabilized by tetrahedral group $[MO_4]^{3-}$ (M=V, P, As). Manganese has very advantageous luminescence properties i.e. strong absorption in the visible region and intense, long-lived NIR emission result from exciting to the one of $^3T_1$, $^1A_1$ or $^3T_2$ states, relaxing to $^1E$ and emitting to $^3A_2$ state, respectively. Manganese is amongst the twelve most abundant elements on Earth and relatively low price, which gives it an advantage comparing to lanthanide type dopants.

Different synthesis processes may be used to form the $Mn^{5+}$ doped inorganic materials. The luminescent inorganic material may be produced as a $Mn^{5+}$ doped luminescent inorganic thin-film layer or as $Mn^{5+}$ doped inorganic particles (either nanoparticles or microparticles). These methods may include deposition methods that are compatible with conventional semiconductor processing methods so that the use of the $Mn^{5+}$ based inorganic luminescent material may be easily integrated in a production process of thin-film photovoltaic devices or solar conversion devices.

In an embodiment, a sintering/grinding method may be used for producing a powder of $Mn^{5+}$ doped inorganic luminescent micron-sized particles. For example, the following synthesis process may be used for the synthesis of 1 gram of $Ba_3(P_{0.99}O_4)_2$:$0.01Mn^{5+}$ powder, with a doping concentration of 1 mol %:

stoichiometrically weighting 0.9827 g $BaCO_3$, 0.3781 g $NH_4H_2PO_4$, and 0.0038 g $MnCO_3$;

mixing and grinding the powders in an agate mortar or a ball mill;

sintering the mixture at 400° C. for 4 hours and subsequently 1300° C. for 8 hours in air;
retrieving and grinding the mixture.

Based on the sintering step particles of around 1 micron in size can be obtained. The dopant concentration can be controlled between 0.1 and 5 mol %, preferably the dopant concentration is selected around 1 mol % $Mn^{5+}$. In this particular sample, a quantum yield of 50% was measured. Increasing the concentration (up to 5%) will result in an increased emission intensity. In that case however, the quantum yield may drop due to concentration quenching.

Hence, the invention may include a method for synthesising a luminescent $Mn^{5+}$ doped inorganic particles, including the steps of: sintering an amount of at least a first inorganic ionic compound with a second and third inorganic ionic compounds, wherein the third ionic compound comprising a $Mn^{2+}$ cation, which after a heating and oxidation process will reach its $Mn^{5+}$ oxidation state. As the formation of the $Mn^{5+}$ ions is not sensitive to air, the synthesis method may be performed in a furnace in air.

The $Mn^{5+}$ ions are also not sensitive to aqueous media. Therefore, in another embodiment, a sol-gel synthesis method may be used for producing an $Mn^{5+}$ doped luminescent material. Such method is particular suitable for the synthesis of nanoparticles. For example, a sol-gel Pechini synthesis procedure for producing 1 gram of $Ba_3(PO_4)_2$: 1 mol % $Mn^{5+}$ nanopowder with $Ba_3P_{1.98}O_8Mn_{0.02}$ formula, may include the following steps:

stoichiometrically weighting 0.9827 g $BaCO_3$, 0.3781 g $NH_4H_2PO_4$, 0.0038 g $MnCO_3$, 5.5776 g $C_6H_8O_7*H_2O$, 0.3713 ml $C_2H_6O_2$ (prod:CA:EG=1:16:4 mol);
dissolving the surfactants: CA (citric acid) and EG (ethylene glycol) in distilled water on the heating plate;
dissolving $BaCO_3$ and $MnCO_3$ powder are in surfactants solution and adding $NH_4H_2PO_4$ solution dropwise under stirring;
evaporating the mixture on the heating plate to form ~30 ml of sol;
ageing the sol for 48 hours at 40° C. in the dryer to form gel structure;
calcinating at 300° C. for 2 hours in air and subsequently at 700° C. for 10 hours in air;
grinding the product in an agate mortar to form a nanopowder.

Pechini's method employs complexing of cations in aqueous-organic medium and makes use of low cost precursors resulting in a homogeneous ion distribution at the molecular level. It is based on the fact that certain α-hydroxycarboxylic organic acids can form stable chelates with several cations. After the addition of a polyhydroxylic alcohol to this mixture, it is heated and the chelate is transformed into a polymer with a homogeneous distribution of cat-ions. The organic part is subsequently eliminated at temperatures as low as 300° C., thereby forming reactive oxides. Nanoparticles may be formed having an (average) particle size between 20 and 300 nm.

Figure 2A:
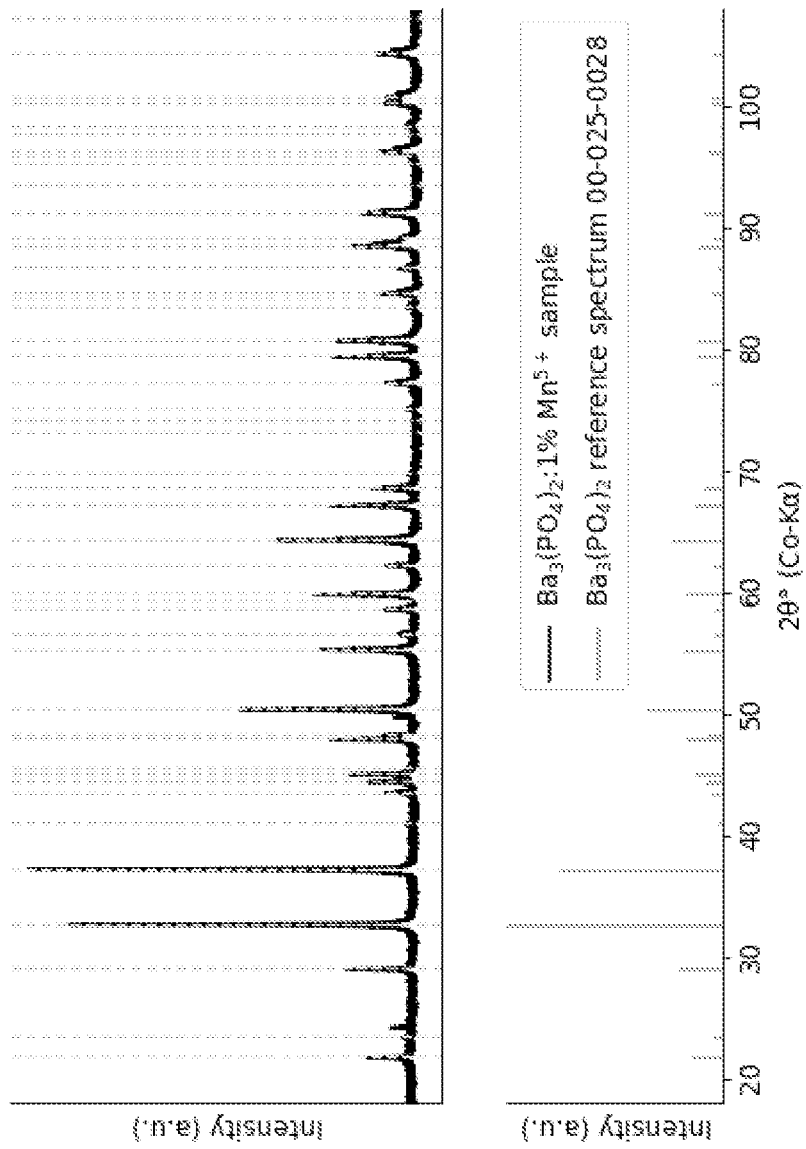
FIGS. 2A and 2B depict XRD patterns of $Mn^{5+}$ doped Ba3(OH)(PO4)3 materials according to various embodiments of the invention.

In a yet further embodiment, a co-precipitation technique may be used for the synthesis of nano-sized $Ba_3(PO_4)_2$: $Mn^{5+}$ particles. Such co-precipitation process may include the steps of:

prepare precursor for $Mn^{5+}$ with $KMnO_4$ solution with suitable concentration (less than 7 g in 100 mL water)
prepare KOH basic solution for suitable pH values (less than 120 g in 100 mL water)
isovolumetrically mix the $KMnO_4$ solution and the KOH solution to form $K_3MnO_4$ ($Mn^{5+}$ ions)
filter the solution to obtain precipitate-free $K_3MnO_4$ solution
stoichiometrically weigh appropriate amount of $Na_3PO_4$ and $BaCl_2$ based on desired doping concentration
add $Na_3(PO_4)$ to the solution with stirring
add $BaCl_2$ to the solution with stirring
filter the solution to obtain $Ba_3(PO_4)2$:$Mn^{5+}$ nanoparticle precipitate The co-precipitation technique enables even smaller particles than a sol-gel method as no high calcinating temperatures are required. Nanoparticles may be formed having an (average) particle size between 1 and 300 nm. FIG. 2A depicts the crystalline nature with an XRD pattern of a $Ba_3(PO_4)_2$ nanoparticles.

Figure 2B:
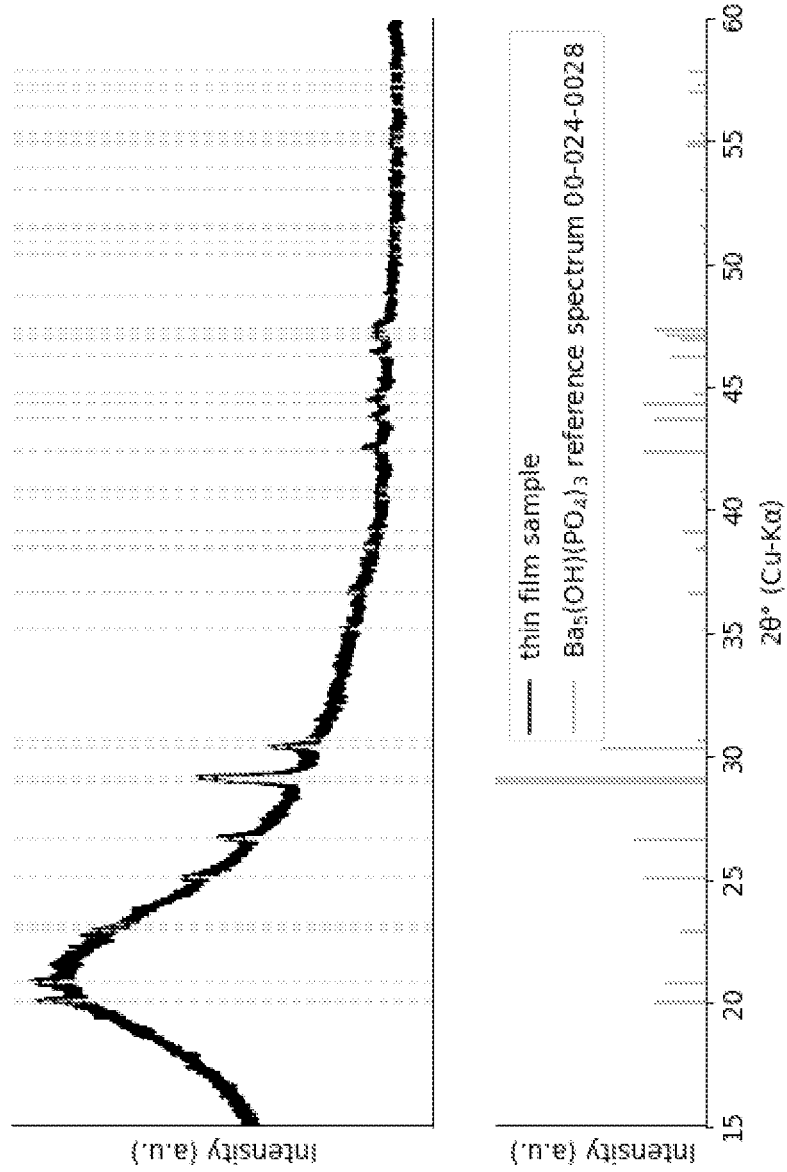
Figure 3:
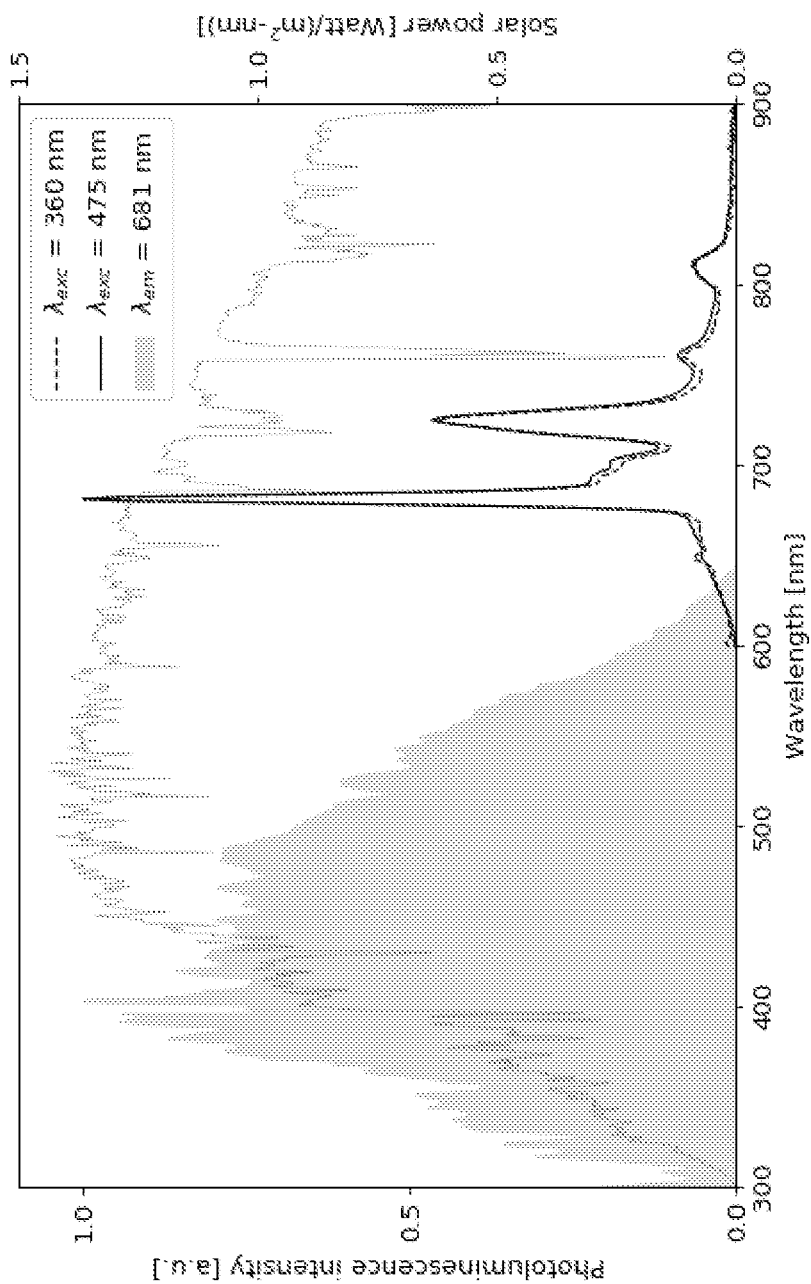
FIG. 3 depicts an excitation and emission spectrum of a SiAlON:$Sm^{2+}$.material according to an embodiment of the invention.

In yet another embodiment, a $Mn^{5+}$ doped luminescent polycrystalline thin-film may be formed on a substrate using a deposition method, such as a sputtering method. The method may comprise providing a sputtering target with an inorganic ionic compound containing $Mn^{5+}$ dopant (e.g. as described above); introducing a gas into the sputtering chamber; and, applying an RF (or pulsed-DC) electric potential to the sputtering target, thereby causing sputtering of material from the target onto the substrate in order to grow a (poly)crystalline or thin-film of a luminescent inorganic ionic compound that is doped with $Mn^{5+}$ cations. The thin-film may have a thickness between 50 nm and 2000 nm and a doping range between 0.1 and 10%. FIG. 2B (previous 6 depicts the polycrystalline nature with an XRD pattern of a sputtered $Mn^{5+}$ doped Ba3(OH)(PO4)3 material according to an embodiment of the invention In a further aspect, the invention relates to luminescent $Sm^{2+}$ doped SiAlON materials. FIG. 3 depicts the normalized solar spectrum, the excitation spectrum (grey area) and the emission spectrum (black line and dotted line) of a $Sm^{2+}$ doped SiAlON thin-film layer. The specific cation composition related to the spectra is: Si around 96 at. %, Al around 1.25 at. %, Sm around 2.75 at. % based upon EDX measurements. The refractive index of around 1.52 indicates the anions are mainly oxygen. As shown in this figure, a substantial part of the UV band and visible band of the solar spectrum is absorbed and converted into radiation of a longer wavelength, in particular, radiation of wavelengths in the visible red/near-infrared band, in particular wavelengths in the range between 650 and 800 nm.

The luminescent properties of the SiAlON:$Sm^{2+}$ material provide a luminescent coating that has a high solar conversion efficiency. FIG. 3 depicts an example of a broadband-absorbing SiAlON:$Sm^{2+}$ coating that absorbs up to 31% of the sunlight. Additionally, the SiAlON:$Sm^{2+}$ coating exhibits a Stokes' shift that is large enough such that the problem of self-absorption in the solar radiation conversion device does not occur. Because the energy of photons is inversely correlated with its wavelengths, a shift to higher photon wavelengths results in a lower amount of energy of each photon. This decrease in energy is represented by the so-called Stokes' efficiency. The SiAlON:$Sm^{2+}$ material of FIG. 3 has a calculated Stokes' efficiency of 69%.

Furthermore, the $Sm^{2+}$ emission wavelengths, covering a range from 650 nm to 800 nm, enable conversion into electrical power using 1.4 eV bandgap GaAs solar modules or crystalline silicon PV modules which are both highly efficient at around 700 nm.

The SiAlON:$Sm^{2+}$ material may be used in a solar radiation conversion devices in the form of an amorphous scatter-free or at least low-scatting thin-film. The material may be deposited using a sputtering technique, preferably a reactive magnetron sputtering technique, based on the elements Al, Si, O and N (SiAlON) doped with $Sm^{2+}$ for converting solar radiation of at least part of the UV and/or visible spectrum into longer wavelength radiation.

Similarly, the SiAlON:$Sm^{2+}$ material may be used in a solar radiation conversion devices as a particle-based coating. In an embodiment, nanoparticles of a SiAlON:$Sm^{2+}$ material may be synthesized using e.g. a sol-gel method including compounds such as $Si(OC_2H_5)_4$, $Al(NO_3)_3$ and samarium salts. Optionally, ethanol and/or citric acid may be added to assist the formation of the nanoparticies. Nitridation can be promoted by a nitrogen-filled sintering environment. A polymeric coating and/or lamination may be realized by embedding the nanoparticles in a suitable (organic) matrix material. Selection and optimization of polymer matrix material may be based on their applications and conditions. Epoxy resin, poly(methyl methacrylate), poly (siloxane), polycarbonate, polyurethane, polyvinyl butyral, ethylene-vinyl acetate, etc. are some common materials that can be used as a matrix material for these nanoparticles.

A synthesis method for producing a SiAlON:$Sm^{2+}$ nanoparticle material may include the steps of:
stoichiometrically weighting 3.8736 g Si(OC2H5)4, 0.1650 g Al(NO3)3, 0.0338 g Sm2O3, 0.1630 g C6H8O7*H2O (Al:CA=1:1 mol);
dissolving the Sm2O3 in diluted nitric acid;
dissolving surfactant CA (citric acid) in the previous solution;
dissolving Al(NO3)3 in the previous solution;
dissolving TEOS (Si(OC2H5)4) dropwise in the previous solution;
evaporating the mixture on the heating plate to form ~30 ml of sol;
ageing the sol for 24 hours at 40° C. in the dryer to form gel structure;
calcinating at 700° C. for 5 hours in air to remove any residual organic content;
sintering at 1000° C. for 1 hour under a reducing atmosphere;
grinding the product in an agate mortar to form nanopowder having an (average) particle size between 20 and 200 nm.

Based on these steps a SiAlO(N):$Sm^{2+}$ nanoparticle material is produced wherein per 1 molar SiAlO(N):$Sm^{2+}$ product; Sm is about 1 mol % of cations (Si and Al) and the Si/Al ratio is 24.

Nanoparticles of the SiAlON:$Sm^{2+}$ material will have an average particle size between 1 to 900 nm, preferably between 1 to 500 nm, more preferably between 1 and 50 nm. Typically, the SiAlON:$Sm^{2+}$ nanoparticles will be of an amorphous material. The crystallinity can be increased by elevating the sintering temperature, which stimulates localized SiO2 phase formation. The increased crystallinity may enhance luminescence but may also increase light scattering.

A synthesis method for producing a SiAlON:$Sm^{2+}$ microparticle material may include the steps of:
stoichiometrically weighting 0.6521 g α-Si3N4, 0.0395 g Al2O3, 0.2799 g SiO2, 0.0338 g Sm2O3;
mixing and grinding all the powder mixture in an agate mortar or ball mill;
sintering the mixture at 1500 C for 8 hours under reducing atmosphere;
grinding the product in an agate mortar or ball mill to form a powder having an (average) particle size between 1 and 50 micron.

Based on these steps a SiAlO(N):$Sm^{2+}$ microparticle material is produced wherein per 1 molar SiAlO(N):$Sm^{2+}$ product; Sm is about 1 mol % of cations (Si and Al) and the Si/Al ratio is 24.

Figure 4:
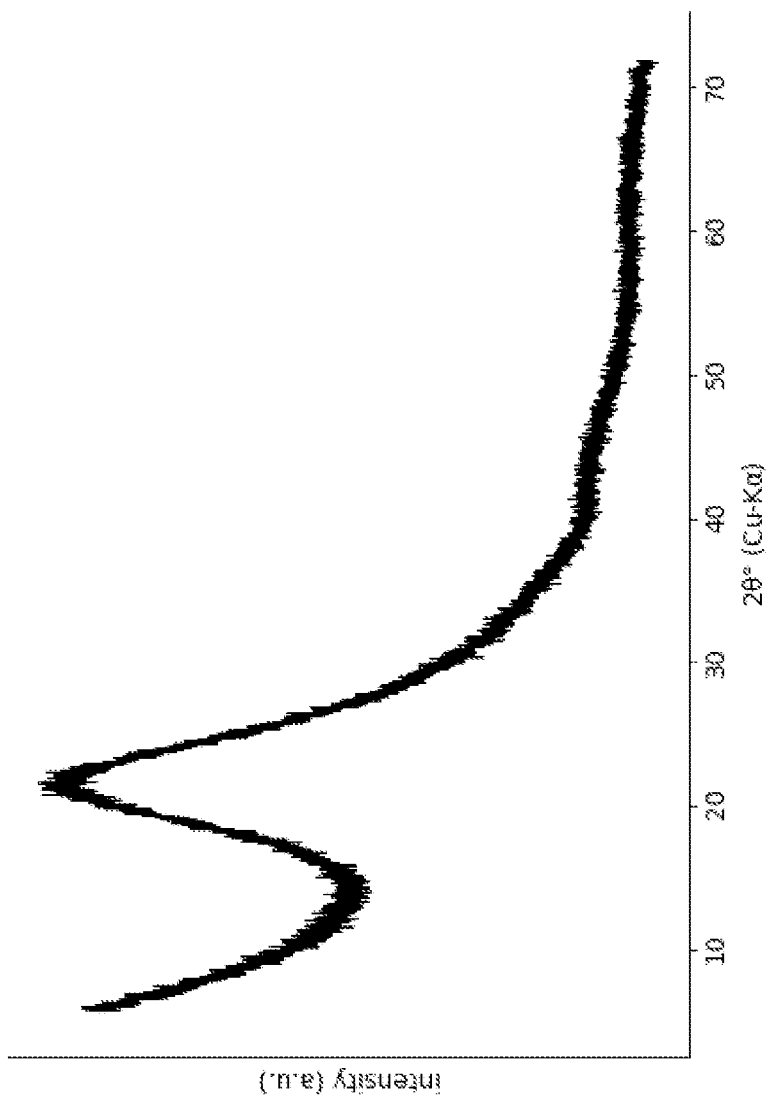
FIG. 4 depicts the amorphous nature with an XRD pattern of a sputtered SiAlON:$Sm^{2+}$ film deposited on a substrate.

FIG. 4 depicts the amorphous nature with an XRD pattern of a sputtered SiAlON:$Sm^{2+}$ thin-film deposited on a glass substrate. As shown in this figure, the XRD pattern is characteristic for an amorphous thin-film structure.

Figure 5:
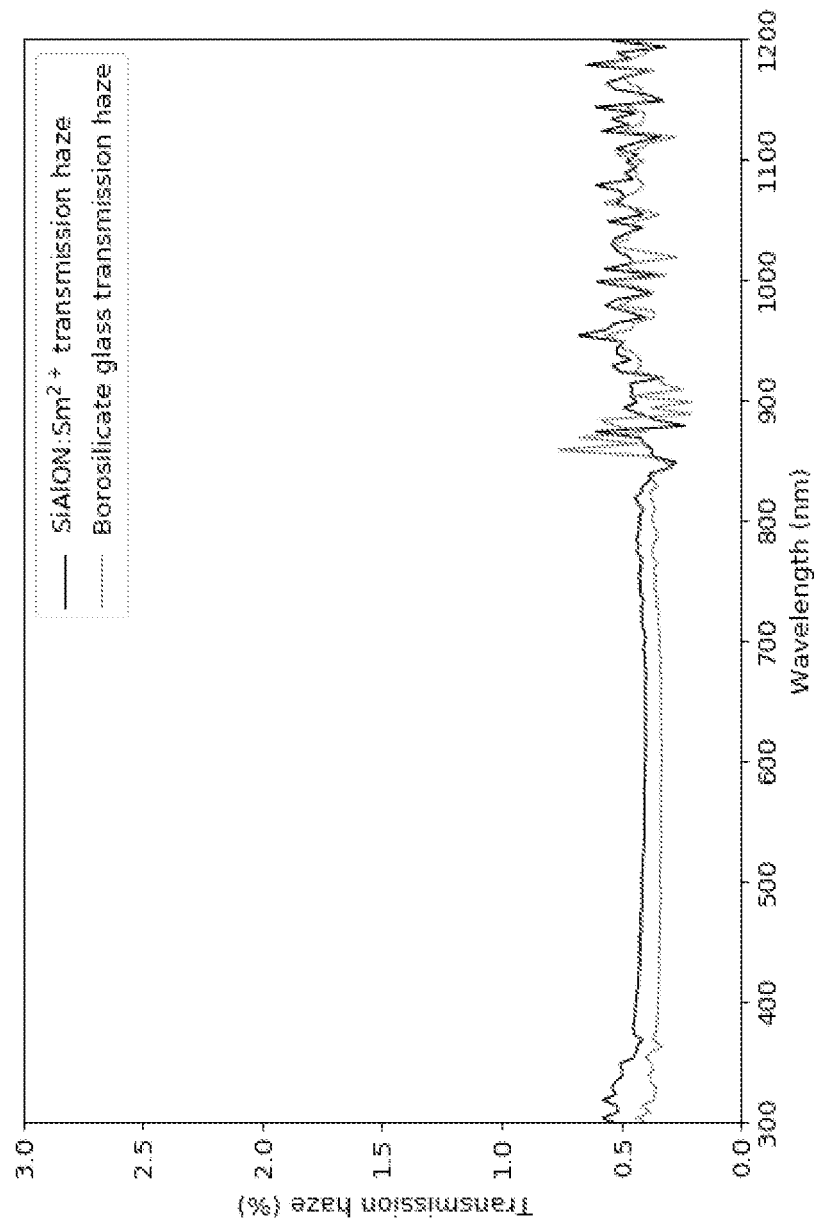
FIG. 5 depicts the haze in a plain glass substrate and in an SiAlON:$Sm^{2+}$ film on glass.

FIG. 5 depicts the haze (in %) representing the ratio between the diffusive transmission and the total transmission in a borosilicate glass (black line) and in the SiAlON:$Sm^{2+}$ film on quartz (grey line). A Perking Elmer Lambda 950 spectrometer was used to measure the haze. As shown in this figure, due to the amorphous nature of the thin-film, the haze in the visible band of the spectrum (390 nm to 700 nm) is extremely low and does not exceed the 2% level at which haze can be detected by the human eye. The graph of FIG. 5 thus shows that the amorphous SiAlON:$Sm^{2+}$ film has a low haze. The material can be readily used in (window) glazing applications due to the fact that SiAlON is commonly used in the glazing industry for antireflection coatings.

Different synthesis processes may be used to form the $Sm^{2+}$ doped SiAlON materials. The luminescent SiAlON material may be produced as a $Sm^{2+}$ doped luminescent inorganic thin-film layer or as $Sm^{2+}$ doped SiAlON particles (either nanoparticles or microparticles). These processes may include deposition methods that are compatible with conventional semiconductor processing methods so that the formation of a $Sm^{2+}$ doped inorganic luminescent material can be easily integrated in a production process of thin-film photovoltaic devices or solar conversion devices.

In an embodiment, a sputtering method may be used for producing an amorphous $Sm^{2+}$ doped SiAlON thin film. The $Sm^{2+}$ doped SiAlON thin films can be deposited on various substrates (e.g. float glass, quartz glass, borosilicate glass, low-iron glass, etc.) using a (magnetron) sputtering system wherein the substrate is kept at room temperature or at an elevated temperature (i.e. between room temperature and 600° C. for glass or between room temperature and 1000° C. for quartz. An exemplary synthesis method for producing an amorphous $Sm^{2+}$ doped SiAlON thin film may include the following steps:
clean a borosilicate glass substrate in an ultrasonic cleaner with soap solution and subsequently rinsed with acetone, ethanol and DI water;
magnetron sputter deposition of SiAlON:$Sm^{2+}$ using either separate Al, Si, and Sm targets or a combined Al—Si—Sm target (for example Si 96 at. %, Al 1.25 at. % and Sm 2.75 at. %; or a combination of: 90 at. %/10 at. % Si/Sm compound target, 90 at. %/10 at. % Si/Al compound target and a pure Si target);
during sputtering, the process gas flow may consist of a mixture of Ar, $O_2$, $N_2$ and $H_2$ (for example 18 sccm Ar, 0.75 sccm $O_2$, 13.25 sccm $N_2$);
following the sputter deposition, the sample may be annealed at temperatures between of 50 and 1000° C., preferably 475° C., to enhance the luminescence;
during annealing the annealing system may be flushed with gas containing $H_2$ (93% $N_2$/7% $H_2$);

Hence, amorphous luminescent $Sm^{2+}$ doped inorganic thin-film layers may be formed on a substrate using a sputtering method. The method may comprise providing a sputtering target comprising Al, Si, Sm into the sputtering chamber; introducing a gas mixture that may include $N_2$, $H_2$, $O_2$ into the sputtering chamber; and, applying an RF (or pulsed-DC) electric potential to said sputtering target, thereby causing sputtering of material from the target onto a substrate so that an amorphous thin-film of the $Sm^{2+}$ doped luminescent inorganic ionic compound is formed.

In an embodiment, a refractive index of the SiAlON:$Sm^{2+}$ material may be selected between 1.5 and 2.1. The refractive index may be selected by selecting a predetermined O/N ratio during the sputtering process. This way, the refractive index of the SiAlON:$Sm^{2+}$ material may be matched to the refractive index of the substrate (such as glass) on which the material was grown.

Figure 6:
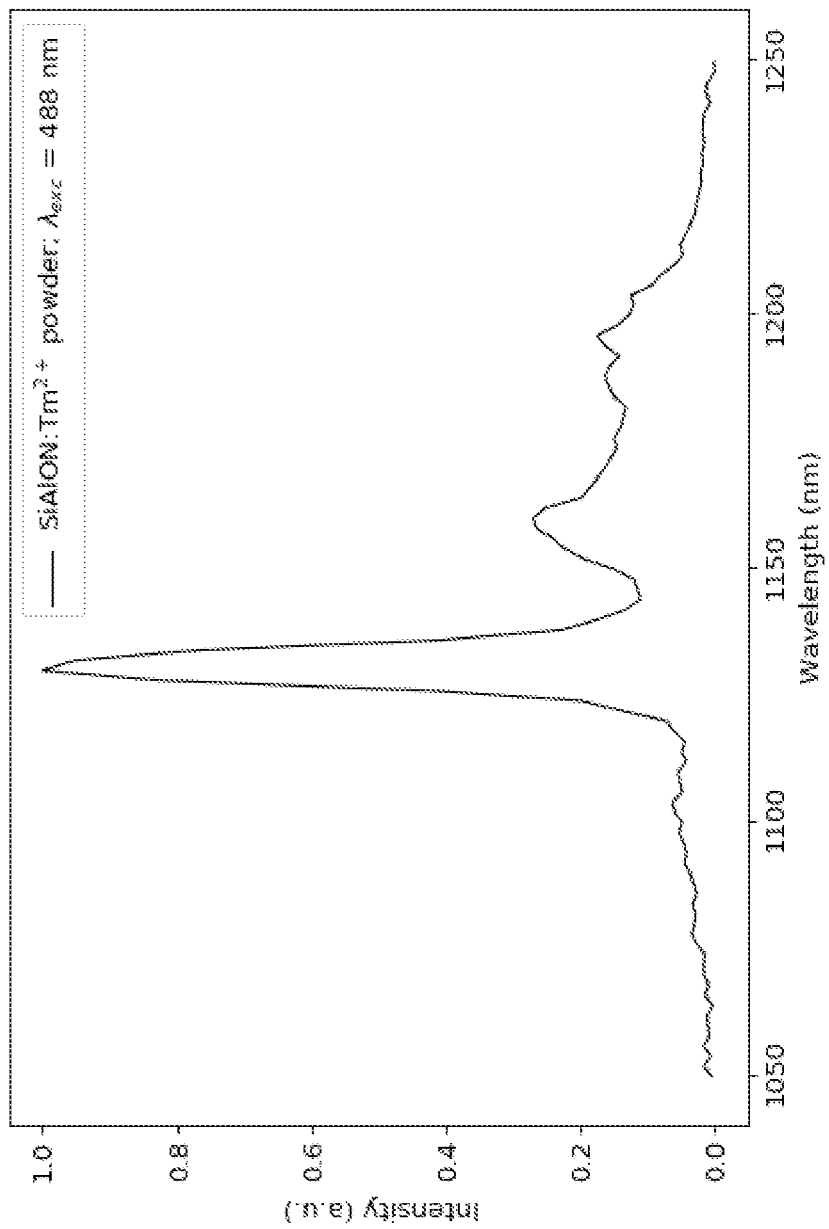
FIG. 6 depicts the emission spectrum of an SiAlON:$Tm^{2+}$ .material according to an embodiment of the invention.

Additionally, in a further embodiment, the luminescent $Tm^{2+}$ doped SiAlON material may be formed using a sputtering technique as described above. The synthesis of the SiAlO(N):$Tm^{2+}$ powder is identical to the synthesis of the SiAlON:$Sm^{2+}$ powder with the exception that instead of Sm2O3 an amount of 0.0372 g Tm2O3 is used. The SiAlON:$Sm^{2+}$ material absorbs radiation in the UV band, the visible band and part of the near-infrared band of the solar spectrum and converts radiation in these bands into radiation of a predetermined nearinfrared band of the spectrum. In particular, the luminescent $Tm^{2+}$ doped SiAlON material exhibits infrared emission in the 1100-1200 nm band, including a sharp emission peak around 1140 nm as shown by FIG. 6. The $Tm^{2+}$ doped SiAlON material exhibits broadband absorption of radiation in the solar spectrum, no self-absorption and has excellent optical and mechanical properties.

Figures 7A, 7B:
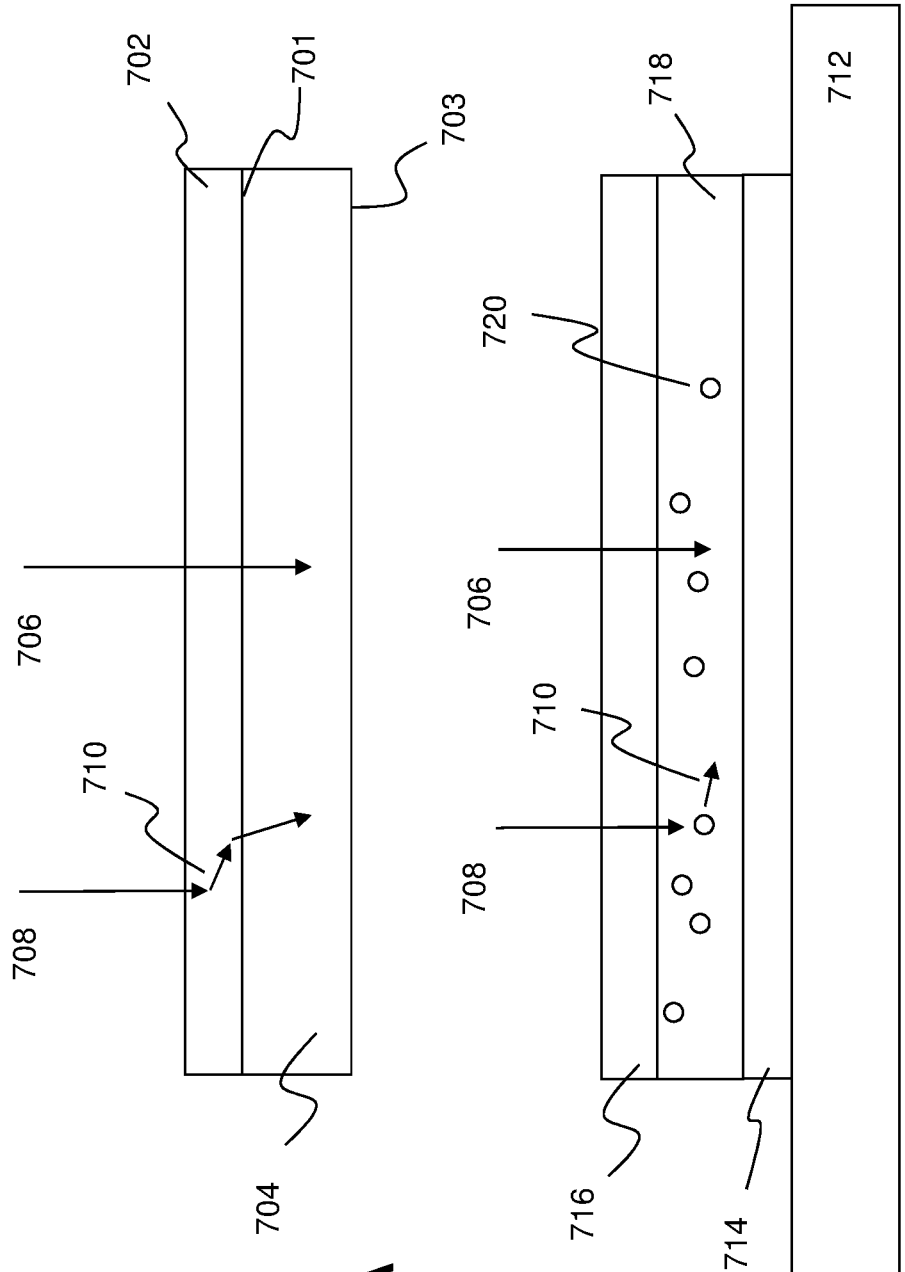
FIG. 7A-7B depict cross-sections of schematic solar radiation conversion devices according to an embodiment of the invention.

FIGS. 7A and 7B depict schematic cross-sections of solar radiation conversion devices according to an embodiment of the invention. In particular, FIG. 7A depicts a solar radiation conversion device comprising one or more luminescent conversion layer (LCLs) 702 and at least one photovoltaic (PV) device 704 comprising a first surface 701 and second surface 703. At least one of the one or more LCLs may include a luminescent material as described with reference to FIG. 1-6. Depending on the configuration, the first (top) surface of the photovoltaic device may be a light receiving surface. Alternatively, e.g. in case of a (partially) transparent photovoltaic device, both the first and second surface may be light receiving surfaces. A luminescent conversion layer may be coated or deposited on or at least over the first and/or second surface of the photovoltaic device. In an embodiment, the luminescent conversion layer may comprise a doped luminescent thin-film layer as described in this disclosure. In another embodiment, the conversion layer includes a coating of a transparent matrix material comprising particles, preferably microparticles or nanoparticles, wherein the particles comprise a doped luminescent material as descried in this disclosure.

Radiation from the UV band and visible band 708 of the solar spectrum is converted by the luminescent conversion layer 702 into radiation of a visible red/near infrared band (e.g. the 650-800 nm band associated with radiation transmitted by the $Sm^{2+}$ ions) and/or into radiation of the near-infrared band (e.g. the 1100-1250 nm band associated with radiation transmitted by $Tm^{2+}$ and/or $Mn^{5+}$ ions). The converted radiation is subsequently absorbed by the photovoltaic device and converted into electrical power.

In an embodiment, the photovoltaic device may include one or more layers which are optimized for transforming radiation in the visible red/near infrared band into electric power. For example, photovoltaic devices including one or more layers of an IV and III-V semiconductor, including e.g. crystalline (e.g. poly, micro or nanocrystalline) or amorphous silicon solar modules, gallium arsenide (GaAs) type modules, cadmium telluride (CdTe) type modules and/or indium phosphide (InP) solar modules. In another embodiment, the photovoltaic device may include one or more layers that are optimized for transforming radiation in the near-infrared band into electric power. The photovoltaic device absorbs radiation transmitted by the luminescent material, e.g. radiation in the visible red band and/or radiation in the near-infrared band of the solar spectrum 706 and converts the absorbed radiation into electrical power.

FIG. 7B depicts a cross-section of a solar radiation conversion device comprising a luminescent material as described in this disclosure. The device may comprise a substrate 712, preferably a transparent substrate, comprising a multi-layered thin-film photovoltaic device. The photovoltaic device may comprise a first contact layer 714 formed on a first surface of the substrate. A solar radiation absorbing active layer or multilayer 718 is formed over the first contact layer and a second layer 716 is formed over the active layer.

In an embodiment, the photovoltaic device may comprise at least one layer comprising infrared absorbing quantum dots (i.e. nanoparticles having a size such that quantum-confinement effects are induced in the particles, i.e. reducing the size of the particles to less than the Bohr radius of the electron and hole functions in the semiconductor) and particles, e.g. microparticles or nanoparticles of a luminescent material as described in this disclosure. In an embodiment, the size of at least part of the infrared absorbing quantum dots may be optimized for absorption of infrared radiation that is transmitted by $Tm^{2+}$ and/or $Sm^{2+}$ doped luminescent nanoparticles. For example, PbS quantum dots that have a particle size of around 3-4 nm will absorb (near) infrared radiation around 900-1110 nm. Hence, in this embodiment an infrared part 706 of the solar radiation may be absorbed directly by infrared absorbing quantum dots while the UV and the visible part of the solar radiation is converted by the luminescent particles into infrared solar radiation 710. This way, the overall conversion efficiency of a simple infrared photovoltaic device may be extended on the basis of visible solar radiation that is converted into infrared solar radiation. In another embodiment, the photovoltaic device may comprise further comprise one or more further broadband-absorbing luminescent thin-film layers of a luminescent material as described in this disclosure. These thin-film layers may be crystalline layers (e.g. nano-, micro- or polycrystalline) or amorphous. Such layers may be positioned between the substrate and the first contact layer in order to increase the transformation of the radiation of the UV/visible band of the solar spectrum into radiation of the visible red/(near) infrared band or the near-infrared band of the solar spectrum.

FIG. 8A-8C depict schematic cross-sections of solar radiation conversion devices, in particular luminescent solar energy concentrator devices, comprising inorganic luminescent material according to various embodiments of the invention. The solar radiation conversion devices may include at least one waveguide structure 802. The waveguide structure may have the form of a slab or a pane of a transparent organic or inorganic material, e.g. glass, comprising a first (top) surface 803, a second (bottom) surface 805 and one or more edges 806. At least part of the edges 806 of the waveguide structure may be coupled to at least one photovoltaic device 808. In other embodiment, the waveguide structure may have a curved from.

In the embodiment of FIG. 8A, the waveguide structure comprises a transparent organic or inorganic matrix material in which particles 810, preferably nanoparticles, of an inorganic luminescent material as described in this disclosure are embedded. When solar radiation 800 that enters the waveguide structure is absorbed by one or more energy bands of the dopant sites in the luminescent particles, the excited dopant sites converts the absorbed solar radiation into radiation 814 in a predetermined band as described in the embodiments of this application, e.g. the visible red band and/or the near infrared band. At least part of the radiation emitted by excited dopants may be guided via the waveguide structure towards the edges of the waveguide. A photovoltaic cell 808 connected to the edge converts the photons that are emitted by ions in the luminescent material into electrical power.

Doped particles, microparticles and/or nanoparticles, of an inorganic luminescent material as described in this disclosure may be embedded in a transparent organic or inorganic matrix material that has excellent transmittance properties in the near-infrared range of the optical spectrum. In an embodiment, organic transparent matrix materials may include poly(methyl methacrylate) (PMMA) or a polycarbonate. In another embodiment, inorganic transparent matrix materials may include a glass material. In an embodiment, the refractive index of the matrix material may be selected to match the refractive index of doped microparticles so that losses due to scattering of the emitted light out of the waveguide structure is minimized.

In the embodiment of FIG. 8B, the waveguide structure may be formed of a transparent organic or inorganic material, wherein at least part of the top and/or bottom surface of the waveguide structure may be covered with a luminescent layer 816, e.g. a thin-film luminescent layer, that may comprise an inorganic luminescent material as described in this specification.

In an embodiment, the thin-film luminescent layer may be formed of a transparent matrix material in which particles, preferably nanoparticles, of an inorganic luminescent material as described in this specification are embedded. Alternatively, the thin-film luminescent layer may be an inorganic luminescent (poly)crystalline or an amorphous thin-film layer that is formed on the waveguide structure. The thin-film layer may be formed over or onto the waveguide structure using a deposition technique e.g. a (co-)sputtering or a reactive co-sputtering method as described above. The use of an amorphous or (poly)crystalline thin-film layer that is coupled as an optically active layer to the waveguide structure provides the advantage that scattering which may occur when using a matrix layer comprising doped particles may be eliminated or at least substantially reduced.

In a further embodiment (not shown), both at least part of the top surface and the bottom surface of the waveguide structure may be provided with a thin-film luminescent layer. This way, at least part of the sunlight that passes the top and bottom side of the waveguide structure may be converted into visible light and/or (near) infrared light which is captured in the waveguide and which is guided by the waveguide structure towards the photovoltaic devices.

FIG. 8C depicts an embodiment of a solar conversion device that comprises one or more luminescent layers that are similar to those described with reference to FIG. 8B. In this embodiment however, the one or more luminescent layers 816 are embedded in the waveguide structure 802.

FIG. 8D depicts yet another embodiment of a solar conversion device including a waveguide structure 802, e.g. in the form of an transparent waveguiding coating, which is configured to guide at least part of radiation 814 emitted by a luminescent material (not shown) towards the edge of the waveguide structure where a photovoltaic device is located. Hence, in this case, the radiation of the luminescent materials falls onto the waveguide structure and at least part of the radiations is refracted by the waveguide material and trapped within the layer. The trapped radiation is then guided via total internal reflection towards the PV device.

In an embodiment, the at least one photovoltaic device 808 may be optimized for transforming radiation in the near-infrared band (as generated by the luminescent material) into electric power. For example, in an embodiment, the photovoltaic device may comprise a Copper Indium Gallium (di)Selenide (CIGS) material. In another embodiment, the photovoltaic device may comprise a Copper Indium (di)Selenide (CIS) material. These materials are very efficient for converting emitted near-infrared radiation emitted by the excited dopant sites into electrical energy. In a further embodiment, the photovoltaic device may comprise a NIR/IR absorbing organic layer or a NIR/IR dye-sensitized layer. In an embodiment, the photovoltaic cell may comprise an organic semiconducting layer, e.g. MEH-PVV, that is sensitized with NIR/IR absorbing quantum dots. For example, by controlling the size of low-band gap (binary) semiconductors (e.g. PbS, PbSe, InAs and/or HgTe) quantum dots, the quantum dots may be tailored to absorb in the (near) infrared spectrum between 900 and 2000 nm. See e.g. Sargent et al in "Solution-based Infra-Red Photovoltaic Devices, Nature Photonics 3, 325-331 (2009). In another embodiment, the photovoltaic cell may comprise a (single) walled carbon nano-tube layer or a graphene active NIR/IR absorbing layer.

In another embodiment, the at least one photovoltaic device 808 may be optimized for transforming radiation in the red visible/near infrared band (as generated by the luminescent material) into electrical power. For example, photovoltaic devices including one or more layers of an IV and III-V semiconductor, including e.g. crystalline (e.g. poly, micro or nanocrystalline) or amorphous silicon solar modules, gallium arsenide (GaAs) type modules, cadmium telluride (CdTe) type modules and/or indium phosphide (InP) solar modules.

The devices depicted in FIG. 8A-8D are non-limiting examples embodying the invention and many variations and/or combinations of features of embodiments in this disclosure are possible without departing the invention. For example, in an embodiment, a solar radiation conversion device may comprise a waveguide structure comprising one or more inorganic luminescent layers provided over the first and/or second surface of the waveguide structure and one or more inorganic luminescent layers embedded in the waveguide structure. In a further embodiment, one or more $Tm^{2+}$, $Mn^{5+}$ and/or $Sm^{2+}$ doped SiAlON thin-films may be part of an antireflection layer, protective barrier layer and/or thermal barrier layer provided over the waveguide structure. In a further embodiment, at least part of the photovoltaic cell may be part of or integrated with the waveguide structure. In yet a further embodiment, one or more optical layers may be provided over the first and second surfaces of the waveguide structure wherein at least part of the optical layers have refractive and/or reflective properties selected to improve the waveguiding properties of the waveguide structures.

Figure 9:
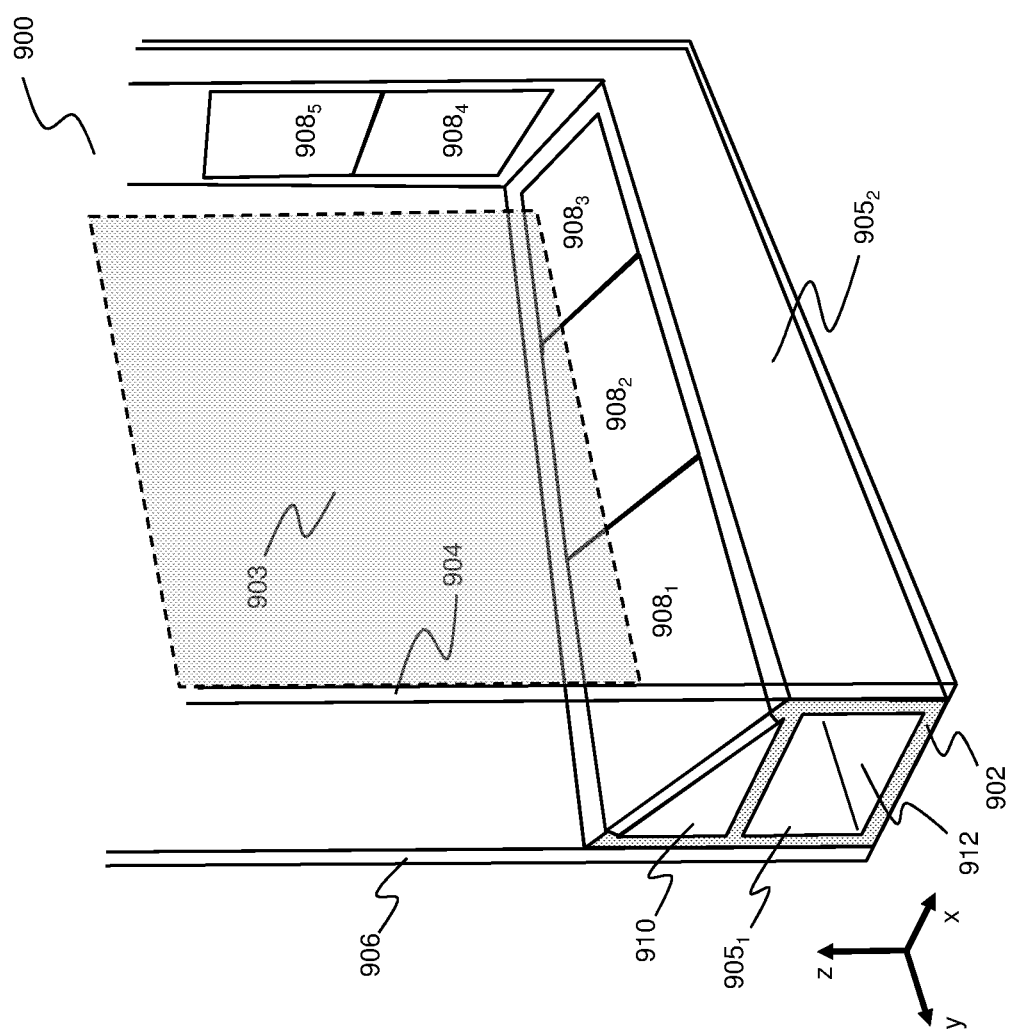
FIG. 9 depicts a solar conversion device according to another embodiment of the invention.

FIG. 9 depicts a solar conversion device according to another embodiment of the invention. In particular, FIG. 9 depicts at least part of a power-generating glazing assembly that uses an inorganic luminescent material as described in this disclosure. The figure depicts a power-generating multi-pane glazing assembly 900 comprising a peripheral spacer structure 902 along the peripheral areas of a first glass pane 904, and second glass pane 906 (in FIG. 9, the surface plane of the glass panes coincides with the y-z plane). The glazing assembly may further include a central window area 903, wherein at least part of the window area of the first and/or second glass pane is provided with a coating that includes an inorganic luminescent material as described in this disclosure. In an embodiment, the first and/or second glass pane may comprise a multi-layer coating wherein one or more of the layers of the multilayers comprising one or more doped luminescent materials as described in this disclosure. In an embodiment, at least one of the layers may comprise $Tm^{2+}$ and/or $Sm^{2+}$ doped SiAlON particles and/or $Mn^{5+}$ doped particles. In another embodiment, at least one of the layers may is a $Tm^{2+}$ and/or $Sm^{2+}$ doped SiAlON amorphous thin-film layer or a $Mn^{5+}$ doped thin film layer.

The peripheral spacer structure may form an elongated peripheral spacer structure formed along the peripheral areas of all sides of the window panes in order to fixate the two glass panes at a predetermined distance from each other. The peripheral spacer structure includes mounting members for positioning multiple PV modules in a tilted manner (wherein the tilt can be selected between 0 and 90 degrees). along the peripheral areas of the multi-pane glazing assembly. The PV modules are mounted such that the light receiving areas of the PV modules are tilted towards the outer glass pane.

Different materials may be used to form the peripheral spacer structure. For example, in an embodiment, the spacer structure may be a hollow metal spacer structure. Suitable materials include e.g. aluminum, stainless steel, or galvanized steel. A metal spacer may have high thermal conductivity, which may reduce the energy-saving benefits of multiple panes, gas fills, and insulating frames. In another embodiment, a non-metal spacer structure may be used. Such non-metal spacer structure may provide improved thermal performance. Suitable materials for such non-metal spacer structure include a composite, a structural foam (e.g. EPDM or silicone foam) or a thermoplastic material. In further embodiments, the spacer structure may include both metal and non-metal materials.

The peripheral spacer structure may be configured to provide a spacing between at least two glass panes, a first (inner) glass pane 904 and a (second) outer glass pane 106. The spacer structure may include bonding surfaces, a first bonding surface 905$_1$ for bonding an inner glass plane and a second bonding surface 905$_2$ for bonding an outer glass pane using a suitable bonding agent. The peripheral spacer structure may bond the glass panes at the peripheral area, e.g. the edges, of the (typically rectangular) glass panes. In an embodiment, the peripheral spacer structure may form or may be part of a sealing structure for sealing, preferably hermetically sealing, the inter-pane space, i.e. the space between the glass panes. In some embodiments, the space between the glass panes may be filled with a certain gas, e.g. Argon or Krypton, in order to increase the thermal and/or acoustic insulation.

The spacer structure 902 may be structured as an (extruded) tube having a predetermined cross-sectional profile as shown FIG. 9, including a body part 912, e.g. a hollow body part, and a mounting part 910 for removably mounting one or more photovoltaic (PV) modules 908$_{1-5}$. As shown in FIG. 9, the mounting part of the peripheral spacer structure may include one or more mounting members which are adapted to position the PV modules under an angle inside the space between the two glass panes so that the light receiving surfaces of the PV modules are tilted towards the outer glass pane. The tilt angle may be selected to have a value so that the light-receiving surface of the PV modules are tilted towards the outer glass pane to optimize the reception of solar light and to avoid shading effects. In an embodiment, the tilt angle may be selected based on the geographical location, e.g. the latitude, of the building in which the glazing assemblies are used. In a further embodiment, the tilt angle of the spacer structure at one side of the glazing assembly may differ from the tilt angel of the glazing assembly of another side of the glazing assembly. This way glazing assemblies may be optimized for use in different orientations, e.g. on the north side or south side of a building. The PV modules are mounted onto the spacer structure. This way, the spacer structure and the PV modules may be fabricated separately, i.e. before the spacer structure is bonded to the glass panes.

Figure 10:
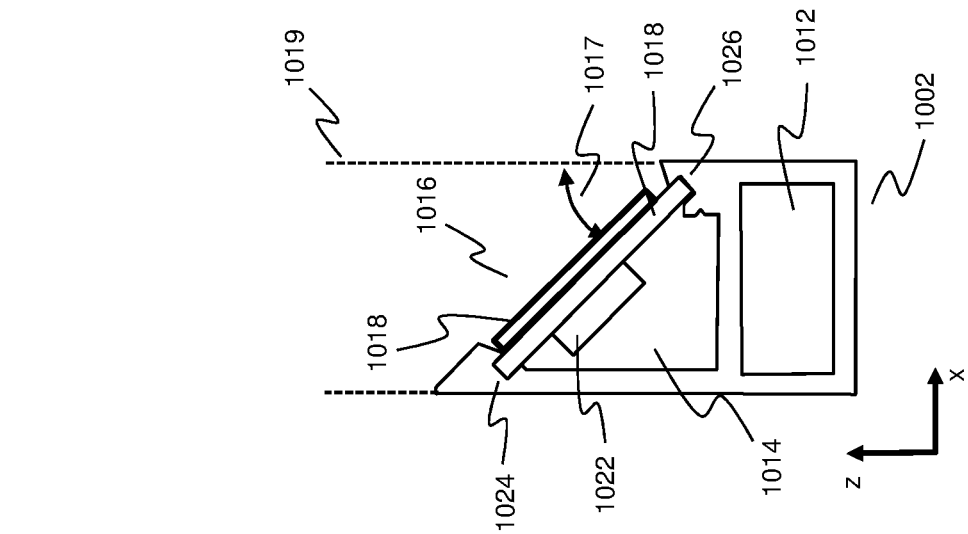
FIG. 10 depicts a cross-sectional view of a peripheral spacer structure for a solar conversion device according to an embodiment of the invention.

FIG. 10 depicts a cross-sectional view (the z-x plane) of a peripheral spacer structure for a solar conversion device according to an embodiment of the invention. In particular, FIG. 10 comprises a peripheral spacer structure 1002 of a power-generating glazing assembly including a rectangular base part 1012, e.g. a hollow rectangular base part, and a mounting part 1014 for mounting a PV module 1016 under a tilt angle 1017 with the plane 1019 of the glass panes. A PV module may include (an array of) photovoltaic devices 1018 mounted on a printed circuit board (PCB) 1020. Further, electronic components 1022 associated with the PV devices, e.g. bypass diodes and other discharge protection electronics, may be mounted on the PCB. The mounting part may comprise a first (inner) fastening member 1024 and second (outer) fastening member 1026 for mechanically fixating PV modules to the peripheral spacer structure. Both fastening members may extend in the y-z plane. In an embodiment, the fastening members may be configured as clamping members for clamping the modules in position. In another embodiment, the fastening members may comprise sliding members which engage with the edges of the PCB. The dimensions of the fastening members may be selected such that a certain thermal expansion of the PCB is allowed without causing mechanical stress in the PCB and/or PV devices.

As shown in FIG. 10, the peripheral spacer structures include a first (inner) fastening member that has a flat structure in the y-z plane and includes a back surface to which the inner glass pane can be bonded. It further includes a second (outer) fastening member that has a flat structure in the y-z plane and includes a front surface to which the outer glass pane can be bonded. The fasting members are configured to fixate the modules in a tilted position so that the PV devices are facing the outer glass pane. To that end, the inner fastening member may extend further in the y-direction than the outer fastening member thereby providing a PV cell module a tilted position. The tilt angel may be selected between 10 and 80 degrees, preferably between 20 and 70 degrees, more preferably between 30 and 60 degrees. In some embodiments, the tilt angle may be selected between 40 and 50 degrees, preferably around 45 degrees.

Hence, the peripheral spacer structure depicted in FIGS. 9 and 10 provides an efficient structure for fixing the light receiving surfaces of the PV modules in a tilted position between two (or more) glass panes in a peripheral area of the window. The light receiving surface of the PV modules are tilted towards the outer glass pane so that it will receive more light when compared to prior art solutions. The tilt can be selected on the basis of the application and/or the geographical location the glazing assembly will be used. The peripheral spacer structure allows the PV modules to be mounted before the window planes are bonded to the peripheral spacer structure.

While the glazing assemblies of FIGS. 9 and 10 are described with reference to a two-pane glazing assembly, it is submitted that a skilled person will understand that the invention may also be used in multi-pane, e.g. three or four pane glazing assemblies. In that case, the peripheral spacer structure includes means for positioning multiple panes at a spaced distance from each other, wherein in the peripheral parts of each of the spaces formed by two window panes one or more tilted PV modules may be arranged.

Figure 11:
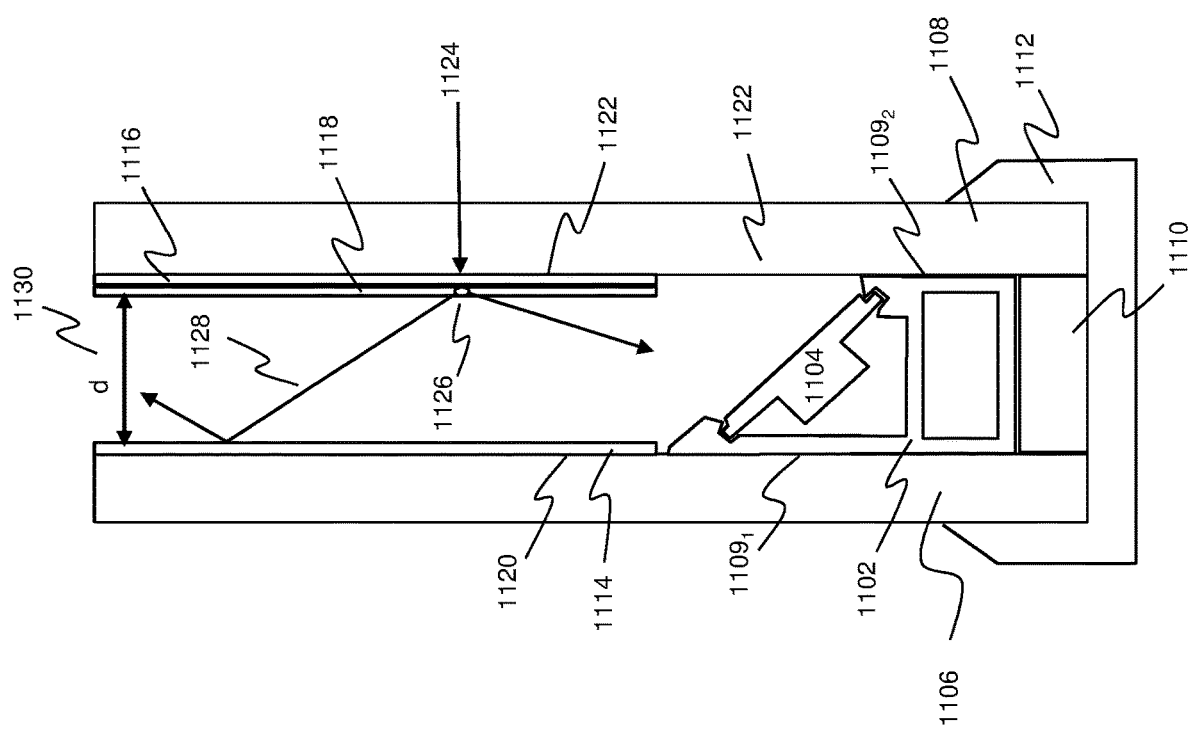
FIG. 11 depicts a cross-sectional view of a power-generating wave-guide based glazing assembly according to an embodiment of the invention.

FIG. 11 depicts a cross-sectional view of a power-generating wave-guide based glazing assembly according to an embodiment of the invention. As shown in FIG. 11, the multi-pane glazing assembly may include a spacer structure comprising tilted PV modules 1104, e.g. a spacer structure 1102 as described with reference to FIG. 10. The glass structure may further comprise a first (inner) glass pane 1106 and a second (outer) glass pane 1108, wherein the peripheral areas (at the edges) of the glass panes are bonded to bonding surfaces $1109_{1,2}$ of the spacer structure so that the parallel surfaces of the glass panes are fixed at a predetermined distance d. When mounted in a building, the second (outer) glass pane is the glass pane is exposed to the outside environment.

The bonding may provide a first seal for sealing the space between the two glass panes. Here, distance d may be selected such that the thermal properties of the glazing structure is optimized, e.g. such that convection in the space between the glass panes is eliminated or at least minimized. The spacer distance d may be selected between 3 and 30 mm, preferably 5 and 25 mm, more preferably between 10 and 20 mm. A seal 1110 at the edge of the glass panes may provide a second seal for sealing the space between the two glass panes. Further, a sash 1112 may keep the glazing assembly that includes the spaced glass panes in place.

In this embodiment, one or more optical layers 1114-1118 may be provided over a substantial part of the surface the first and/or second glass pane. In an embodiment, at least part of the one or more optical layers may be provided over the inner surface of the first and/or second glass panes (i.e. the surfaces that are located within the space between the glass panes). In another embodiment, at least part of the one or more optical layers may be provided over the outer surface of the first and/or second glass panes (not shown).

At least one of the optical layers provided over the first glass pane and/or second glass pane may include an inorganic luminescent material. In an embodiment, the inorganic luminescent material may include a luminescent material which is suitable for use in luminescent solar concentrators. In an embodiment, the luminescent material may include a luminescent material known from the prior art. In another embodiment, the inorganic luminescent material may include a luminescent material as described in this disclosure. In an embodiment, a $Tm^{2+}$ and/or $Sm^{2+}$ doped SiAlON material or a $Mn^{5+}$ doped thin film layer (e.g. in the form of microparticles, nanoparticles or an (amorphous) thin-film layer) may be used.

Total internal reflection of radiation generated by the luminescent material may trap radiation between the two window panes. This way, the two window panes form a waveguide structure for part of the luminescent radiation which will be guided towards the peripheral areas of the glazing assembly and absorbed by PV models in the peripheral area.

In an embodiment, trapping of the luminescent radiation may be improved by configuring at least part of the optical layers to reflect radiation generated by the luminescent material. For example, the reflection layers may be optimized for reflecting radiation of a visible red/near infrared band (e.g. the 650-800 nm band associated with radiation transmitted by the $Sm^{2+}$ ions) and/or radiation of a near-infrared band (e.g. the 1150-1250 nm band associated with radiation transmitted by $Tm^{2+}$ and/or $Mn^{5+}$ ions). For example, a first optical layer 1114 covering the inner surface 1120 of the first glass pane 1106 may comprise a first visible red band and/or near-infrared band reflecting layer and a second optical layer 1116 covering the inner surface 1122 of the second glass pane 1108 may comprise a second first visible red band and/or near-infrared band reflecting layer. Such reflecting layer may be implemented as a dielectric mirror, e.g. a dichroic filter including a multilayer of alternating dielectric layers of predetermined thicknesses, which reflects the luminescent radiation, while being transparent for radiation of other wavelengths. The thin-film reflecting layers may be arranged over the window part of the glass panes.

In an embodiment, the optical layer comprising the inorganic luminescent material may be provided over at least one of the reflecting layers at the inner side of the window panes. This way, the inorganic luminescent layer is positioned between the reflecting layers. Hence, when the outer glass pane is exposed to sunlight, radiation of the solar spectrum may pass the outer glass pane. Part of the solar radiation 1124 will be absorbed by the luminescent layer and converted to radiation of a visible red band and/or a near-infrared band. Excited dopants 1126 in the inorganic luminescent layer may transmit near-infrared radiation 1128, which will be reflected by the near-infrared layers. This way, the infrared radiation is captured between the two infrared reflecting layers, which act as a waveguide structure 1130 for the infrared radiation so that the infrared radiation will be guided towards the peripheral part of the window structure where the radiation will be absorbed by one or more PV module 1104.

Hence, in the embodiment of FIG. 11, the space between the window panes forms a waveguide structure wherein radiation emitted by excited dopant sites in the luminescent layer is guided towards the peripheral part of the glazing assembly and absorbed by a PV model that transforms the radiation into electrical power, In an embodiment, the surface of the outer glass pane may include a central (window) part and a peripheral part 1118 arranged around the central part. The central (window) part may be provided with a reflective infrared coating so that it is transparent for visible light but reflective for (near) infrared light. In contrast, the peripheral part is not covered by a reflective infrared coating. Hence, the peripheral part of the glass pane provides a window that is transparent for both visible and (near) infrared light so that the PV modules are exposed to the whole solar spectrum.

Figure 12:
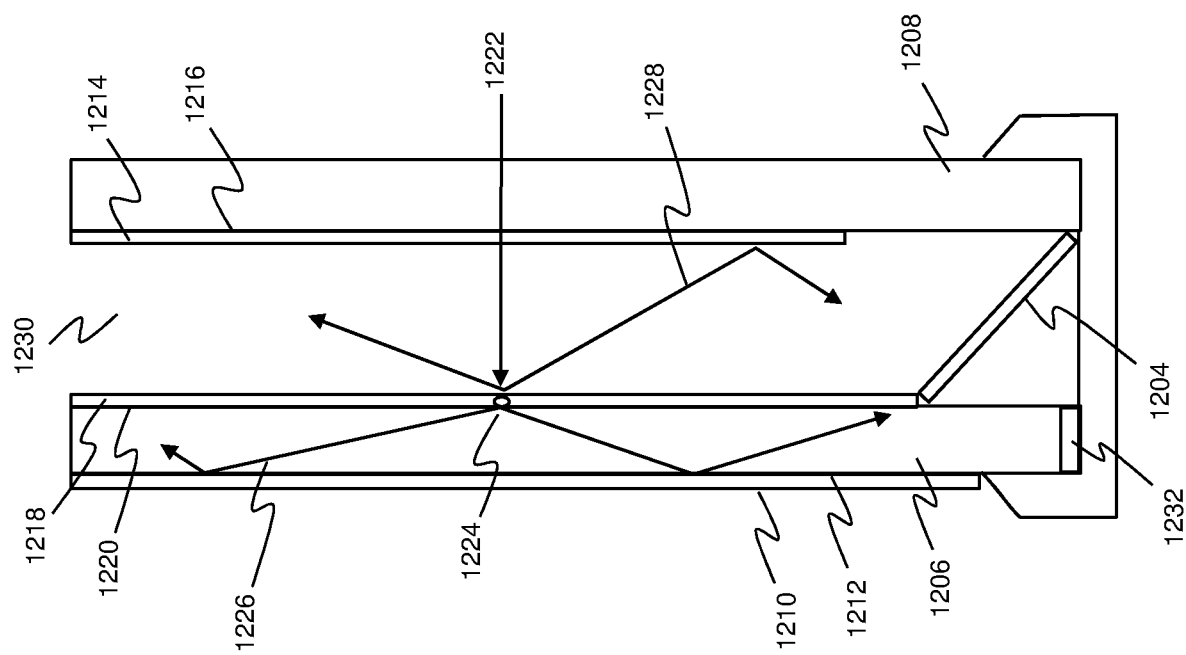
FIG. 12 depicts a cross-sectional view of a power-generating wave-guide based glazing assembly according to an embodiment of the invention.

Various waveguide arrangements for a glazing structure are possible without departing from the invention. For example, FIG. 12 depicts an example of a cross-sectional view of power-generating wave-guide based glazing assembly including a waveguide structure formed by the glass panes in a similar way as described with reference to FIG. 11. In this example however, luminescent radiation may also be trapped within a glass pane and guided to a PV device at the periphery or edge of the glass pane.

Similar to the assembly of FIG. 11, The assembly includes a spacer structure comprising tilted PV modules 1204, a first (inner) glass pane 1206 and a second (outer) glass pane 1208, wherein the peripheral areas (at the edges) of the glass panes are bonded to bonding surfaces of the spacer structure so that the parallel surfaces of the glass panes are fixed at a predetermined distance d. The bonding may provide a first seal for sealing the space between the two glass panes. One or more luminescent layers 1218 may be provided over the inner surfaces of the first and/or second glass panes.

In an embodiment, first reflecting layer 1210 may be provided over the inner surface 1212 of the first (inner) glass pane 1206. In another embodiment, a second reflecting reflector 1214 may be provided over the inner surface 1216 of the second (outer) glass pane 1208, wherein the reflecting layers are configured to reflect radiation generated by the luminescent material. For example, the reflection layers may be optimized for reflecting radiation of a visible red/near infrared band (e.g. the 650-800 nm band associated with radiation transmitted by the $Sm^{2+}$ ions) and/or radiation of a near-infrared band (e.g. the 1150-1250 nm band associated with radiation transmitted by $Tm^{2+}$ and/or $Mn^{5+}$ ions).

Since SiAlON layers are also used as dielectric barriers, luminescent layers may also be provided over (part of the) outer surfaces of the first and/or second glass panes. (For example, $SiAlON:Sm^{2+}$ or $SiAlON:Tm^{2+}$ layers may be provided as part of a dielectric barrier over at least part of the outer surfaces of the first and/or second glass panes. Additionally, a $Mn^{5+}$ doped layer may be provided over at least part of the outer surfaces of the first and/or second glass panes, wherein the $Mn^{5+}$ doped layer is protected by one or more non-doped SiAlON layers and/or one or more $SiAlON:Sm^{2+}$ or $SiAlON:Tm^{2+}$ layers.

Hence, when the outer glass pane is exposed to sunlight, radiation of the solar spectrum 1122 may pass the outer glass pane and hit the optical layer 1218 comprising the inorganic luminescent material. Part of the radiation of the solar spectrum may be absorbed and converted to specific bands in the visible red light and/or near-infrared. Thus, an excited dopant 1224 of the inorganic luminescent layer may transmit radiation 1226 towards the first reflecting layer and radiation 1228 towards the second reflecting layer. This way, the luminescent radiation is captured between the two reflecting layers, which act as a waveguide structure 1230 for the luminescent radiation. In this embodiment, the waveguide structure may include a first waveguide formed by the first (inner) glass pane and a second waveguide formed by the space between the first and second glass pane. This way the luminescent radiation will be reflected towards the peripheral part of the window structure where the radiation will be absorbed by a first photovoltaic cell 1232 associated with the first waveguide part and a second photovoltaic cell 1204 associated with the second waveguide part. In other embodiments, the inner surfaces of both window panes may be provided with a luminescent layer. In a further embodiment, the second (outer) window pane may also act as a waveguide. In a further embodiment, instead of a double glazing assembly, a multi-glazing assembly may be used, including three or more glass panes separated by a spacer structure at the periphery of the glazing structure, wherein window panes may be provide with a luminescent material and wherein the spaces between the window panes may form multiple waveguide structures for guiding luminescent radiation towards PV devices arranged at the periphery of the glazing assembly.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope of the appending claims and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. Device for converting solar radiation into electrical power comprising:
    an inorganic luminescent thin-film layer of a doped host material that is doped with $Mn^{5+}$ ions, the $Mn^{5+}$ ions absorbing radiation of a UV, visible and part of a near infrared band of the solar spectrum and converting the absorbed radiation into radiation of a near-infrared band between 1150 nm and 1250 nm; or,
    an inorganic amorphous luminescent thin-film layer of a host material comprising elements Al, Si, O and N and being doped with $Sm^{2+}$, the $Sm^{2+}$ absorbing a UV and visible band of the solar spectrum and converting the absorbed radiation into radiation of a visible red band between 650 nm and 800 nm or,
    an inorganic amorphous luminescent thin-film layer of a host material, comprising elements Al, Si, O and N and being doped with $Tm^{2+}$ ions, the $Tm^{2+}$ ions absorbing a UV, visible and part of a near infrared band of the solar spectrum and converting the absorbed radiation into radiation of a predetermined near-infrared band between 1100 and 1200 nm;
    at least one photovoltaic device for converting at least part of the converted radiation into electrical power.

2. The device according to claim 1, wherein the dopant concentration of the doped host material is in a range of 0.01% to 90%.

3. The device according to claim 1, wherein the $Tm^{2+}$ or $Sm^{2+}$ doped amorphous thin-film layer has a haze smaller than 3%.

4. The device according to claim 1, wherein the $Mn^{5+}$ doped host material comprises a ternary and/or a quaternary inorganic material, the ternary material being defined by the general formula $M_3(XO_4)_2$ wherein M=Ca, Ba, Sr and X=P, As, V and the quaternary material being defined by the general formula $M_5(XO_4)_3Y$ wherein M=Ca, Ba, Sr and X=P, As, V and Y=OH, Cl, F.

5. The device according to claim 1, wherein the at least one photovoltaic device is configured to transform radiation in the visible red/near infrared band between 650 nm and 800 nm or the near-infrared band between 1100 and 1250 nm into electric power.

6. The device according to claim 1, wherein the inorganic luminescent thin-film layer is part of or associated with a waveguide structure, the waveguide structure being configured to guide at least part of the converted radiation to the at least one photovoltaic device.

7. The device according to claim 6, wherein the waveguide structure comprises a transparent organic or inorganic material having a first surface and a second surface and the inorganic luminescent thin-film layer is embedded in the waveguide structure or the inorganic luminescent thin-film layer is provided over or on the first or second surface.

8. The device according to claim 6, wherein the waveguide structure comprises a first pane and a second pane and at least one spacer structure for providing a predetermined separation between the first and second pane, the inorganic luminescent material is provided over at least one of the surfaces of the first and/or second pane, and the space defined by the first and second glass defining a waveguide structure for guiding at least part of the radiation generated by the luminescent layer towards at least one photovoltaic device.

9. The device according to claim 8, wherein one or more optical layers are provided over the inner or outer surface of the first and/or second pane, the one or more optical layers including one or more reflecting and/or refracting layers for radiation generated by the inorganic luminescent material.

10. The device according to claim 1 wherein at least part of the luminescent inorganic thin-film layer is provided over a light receiving face of the at least one photovoltaic device; and/or, the at least one photovoltaic device comprises two or more of the inorganic luminescent thin-film layers.

11. The device according to claim 1, wherein the dopant concentration of the doped host material is in a range of 0.1 and 50%.

12. The device according to claim 1, wherein the dopant concentration of the doped host material is in a range of 0.2 and 25%.

13. A window assembly comprising a device for converting solar radiation according to claim 1.

14. A window assembly for converting solar radiation into electrical power comprising:
at least a first window pane and a second window pane and at least one spacer structure for providing a predetermined separation between the at least first and second window pane,
an inorganic luminescent thin-film layer of a host material doped with $Mn^{5+}$ ions, the $Mn^{5+}$ ions absorbing radiation of a UV, visible and part of a near infrared band of the solar spectrum and converting the absorbed radiation into radiation of a near infrared band between 1150 nm and 1250 nm; or, an inorganic amorphous luminescent thin-film layer of a host material, comprising elements Al, Si, O and N and being doped with $Sm^{2+}$, the $Sm^{2+}$ ions absorbing a UV and visible band of the solar spectrum and converting the absorbed radiation into radiation of a visible red band between 650 nm and 800 nm; or, an inorganic amorphous luminescent thin-film layer of a host material, comprising elements Al, Si, O and N being doped with $Tm^{2+}$ ions, the $Tm^{2+}$ ions absorbing a UV, visible and part of a near infrared band of the solar spectrum and converting the absorbed radiation into radiation of a predetermined near-infrared band between 1100 and 1200 nm;

wherein the first window pane, the second window pane; and/or, the space between the first and second window panes defines one or more waveguide structures for guiding at least part of the radiation generated by the inorganic luminescent thin-film layer towards at least one photovoltaic device; and, one or more photovoltaic devices positioned along one or more edges of the first and second window pane, the light receiving surface of the PV devices being oriented to receive radiation emitted by the luminescent material.

15. The window assembly according to claim 14, wherein the inorganic luminescent material is provided as a thin-film layer over or on at least one of the surfaces of the first and/or second window pane.

16. The window assembly according to claim 14, wherein one or more optical layers are provided over or on at least part of the surfaces of the first and/or second window pane, the one or more optical layers including at least one reflecting and/or refractive layer for radiation generated by the inorganic luminescent material.

* * * * *